United States Patent [19]
Fukuda et al.

[11] Patent Number: 5,715,039
[45] Date of Patent: Feb. 3, 1998

[54] PROJECTION EXPOSURE APPARATUS AND METHOD WHICH USES MULTIPLE DIFFRACTION GRATINGS IN ORDER TO PRODUCE A SOLID STATE DEVICE WITH FINE PATTERNS

[75] Inventors: Hiroshi Fukuda, Kodaira; Rudolf Murai von Bunau, Koganei, both of Japan

[73] Assignee: Hitachi, Ltd., Tokyo, Japan

[21] Appl. No.: 649,156

[22] Filed: May 17, 1996

[30] Foreign Application Priority Data

May 19, 1995 [JP] Japan ................................ 7-121114

[51] Int. Cl.⁶ ........................ H01L 21/27; G03F 7/20
[52] U.S. Cl. ........................ 355/53; 355/55; 355/77
[58] Field of Search ........................ 356/401; 250/548, 250/559.3; 359/227, 232; 378/147, 150, 151; 355/53, 54, 40, 50, 77

[56] References Cited

U.S. PATENT DOCUMENTS

| | | | |
|---|---|---|---|
| 5,348,837 | 9/1994 | Fukuda et al. | 355/53 |
| 5,446,587 | 8/1995 | Kang et al. | 355/53 |
| 5,552,856 | 9/1996 | Shiraishi et al. | 355/53 |

Primary Examiner—R. L. Moses
Assistant Examiner—Shival Virmani
Attorney, Agent, or Firm—Kenyon & Kenyon

[57] ABSTRACT

In exposing and projecting a mask onto a substrate using projection optics, a first grating is provided between the substrate and the projection optics and a second grating is provided between the projection optics and the mask so that the image of the mask pattern is formed near the substrate surface by the interference of beams diffracted by the first grating. This arrangement produces the effect of virtually increasing the NA of the optical system by up to a factor of two, making it possible to manufacture LSIs with fine patterns.

78 Claims, 16 Drawing Sheets

FIG. 2 (a)  FIG. 2 (b)
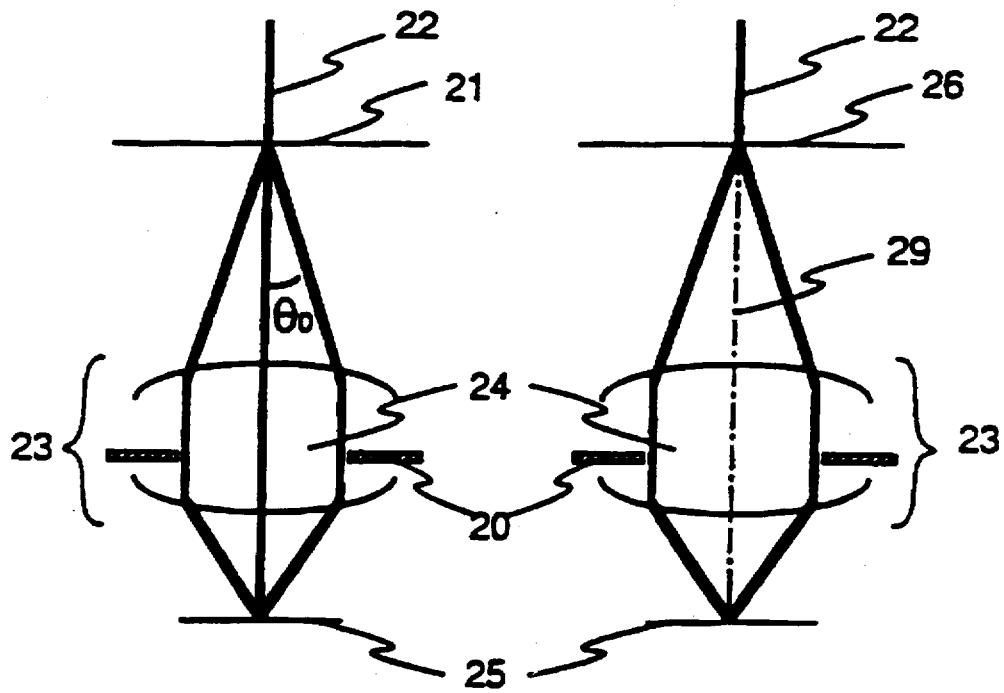
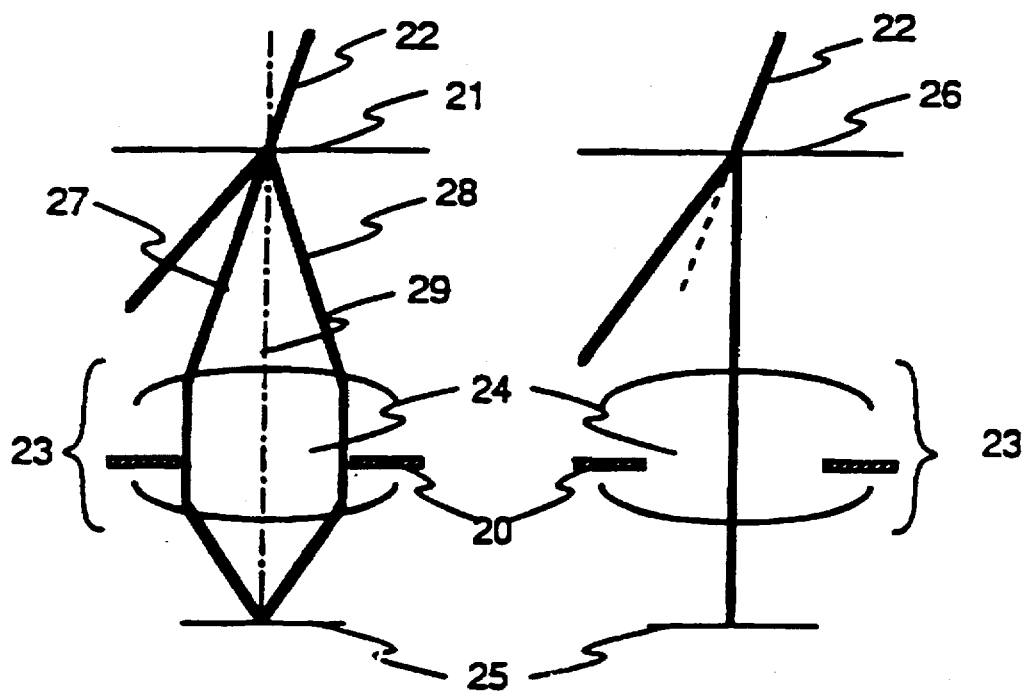
FIG. 2 (c)  FIG. 2 (d)

FIG. 5 (a)
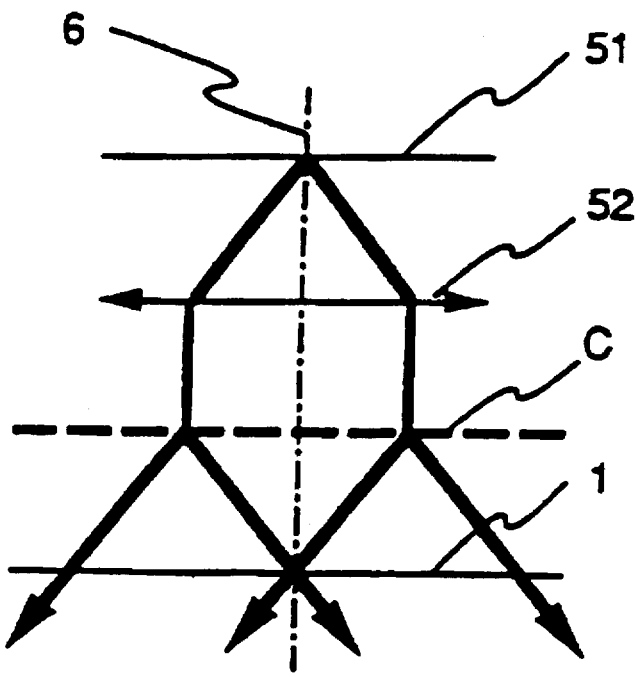
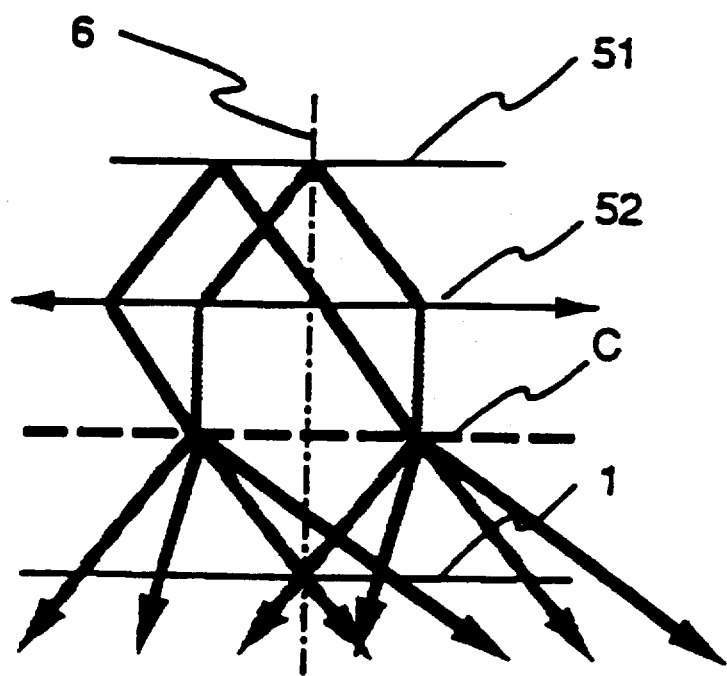
FIG. 5 (b)

NORMALIZED COORDINATES
OF THE PUPIL RADIUS

WAVE FRONT ABERRATION
ON THE PUPIL

FIG. 8 (a)
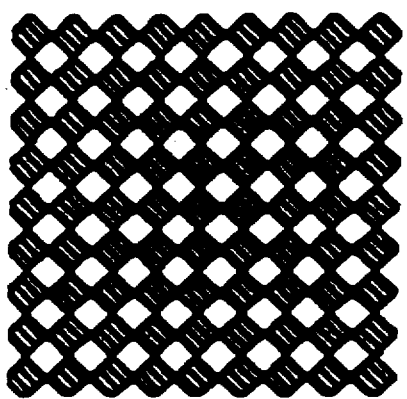 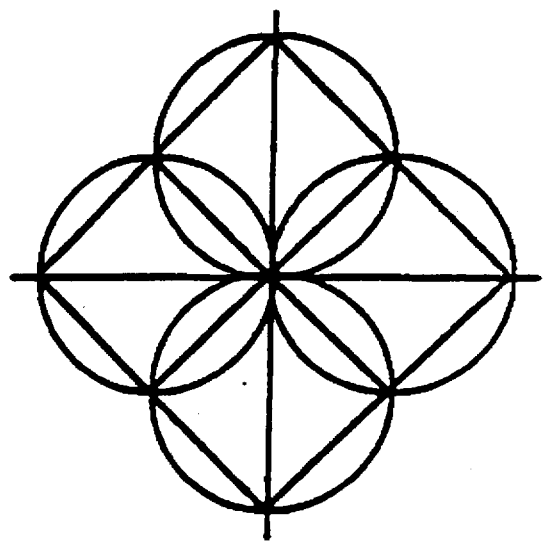
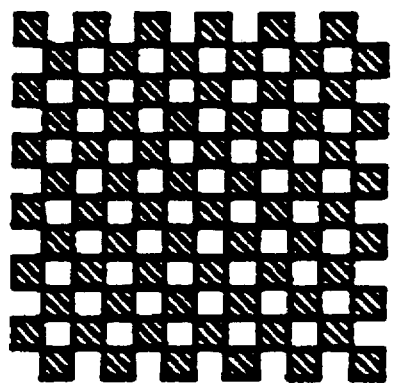 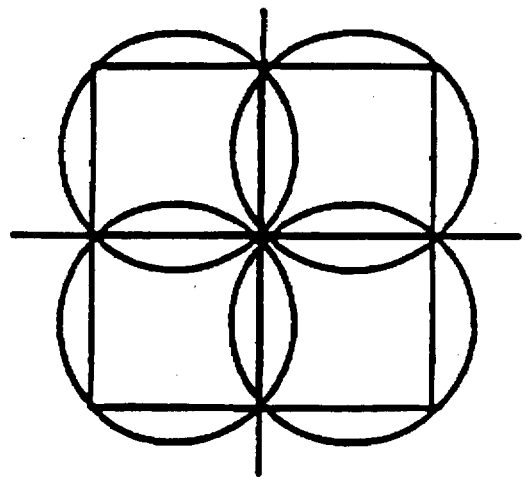
FIG. 8 (b)

— LIGHT PATH IN THE ATMOSPHERE

= LIGHT PATH WHEN THE WAFER-GRATING SPACE IS FILLED WITH LIQUID

PROJECTION EXPOSURE APPARATUS AND METHOD WHICH USES MULTIPLE DIFFRACTION GRATINGS IN ORDER TO PRODUCE A SOLID STATE DEVICE WITH FINE PATTERNS

BACKGROUND OF THE INVENTION

The present invention relates to a projection exposure method for making fine patterns of various devices and to exposure equipment used therefor.

To improve the packing density and operation speed of solid state devices such as LSIs, circuit patterns have been increasingly miniaturized. Also, there are growing demands for finer patterns to improve characteristics of optoelectric devices such as lasers, various quantum devices, and dielectric and magnetic devices. Currently, a reduction projection exposure method, which is excellent in mass production and resolution performance, is widely used for the formation of such patterns. The resolution limit of this method is proportional to the wavelength of exposure light ($\lambda$) and inversely proportional to the numerical aperture (NA) of the projection lens. Hence, the resolution limit can be improved by reducing the wavelength of exposure light and increasing the numerical aperture.

For further improvement of the resolution of the reduction projection exposure method, there are a phase shift mask technique, a modified illumination technique (oblique illumination technique), and a pupil filtering technique. These techniques are designed to utilize the performance of the conventional optical system to its theoretical diffraction limit (cutoff frequency=$2NA/\lambda$). These improvement techniques (often called super resolution techniques) are described, for example, in the "Innovation of ULSI Lithography Technology," Chapter 1, pp. 34–49 (published by Science Forum, 1994, Tokyo).

As means for improving the resolution of a microscope beyond the conventional diffraction limit, there are some methods which expand the spatial frequency bandwidth of an optical system. These methods for expanding the spatial frequency bandwidth are disclosed, for example, in "Applied Physics," Volume 37, No. 9, pp. 853–859 (1968). One of these methods involves performing a scan while maintaining two grating patterns in a conjugate relationship immediately over an object and an image (at least within the depth of focus). This method forms a Moire pattern by superimposing a first grating pattern immediately over the object, and demodulates the Moire pattern by passing the Moire pattern through a lens system and superimposing it on the second grating pattern on the image side. Because the Moire pattern has a lower spatial frequency than those of the object and the first grating pattern, it can pass through the lens system. A technology that applies this method to the reduction projection exposure method is disclosed in Laid-Open Japanese Patent No. 326573/1995. Because mechanically scanning the grating pattern disposed immediately over a wafer is difficult, it has been proposed to provide a photochromic material directly on the wafer, superimpose an interference fringe on it, and scan the interference fringe, making it function as a grating.

These conventional techniques, however, have the following problems.

First, the shortening of wavelength of the exposure light is considered to reach its limit at the ArF excimer laser wavelength (193 nm) because of the required transmittance of the optical material (lens). The problems associated with the lens design and manufacture are considered to limit the numerical aperture (NA) of the projection optics to 0.6–0.7. On the other hand, the resolution limit of the conventional exposure method is generally $0.5\lambda/NA$ and, when the alternating phase shift mask technique is used, the limit is $0.3\lambda/NA$. Hence, even with the use of the lowest limit of the wavelength and the highest limit of NA, it is difficult to form a pattern smaller than 0.1 µm. In the above alternating phase shift mask technique the mask pattern type is limited, and therefore the actual dimensions of more general circuit patterns at the resolution limit are degraded further. While a greater exposure area is being called for as the LSI becomes increasingly larger, it is very difficult to meet the demands for a greater exposure field of the projection optics and for higher NA.

On the other hand, various methods to get around the conventional diffraction limit by expanding the spatial frequency band which have been intended for use with microscopes have been proposed. However, these conventional methods are not necessarily suited for forming, in a wide exposure field (several cm$^2$), the very small image features required in photolithography. For example, in the method using the Moire pattern, the mechanism or optical system for scanning while maintaining two gratings in a conjugate relationship with each other immediately above the mask and the wafer becomes very complicated. Another problem is that because the exposure of the resist is performed with virtually evanescent light, the light intensity decays exponentially making it difficult to expose a thick resist. Further, in the method using a photochromic material, no appropriate material is readily available. Hence, these conventional methods are not necessarily practical in terms of mass production of LSIs.

As a projection exposure method for forming a fine pattern of various solid-state devices, the object of this invention is to provide a novel projection exposure method which gives an improvement beyond the conventional diffraction limit (cut-off frequency). More specifically, it is the object of this invention to provide a novel exposure method that produces almost the same effect as obtained by increasing the NA by a factor of up to two without changing the NA of the projection optics, and to also provide exposure equipment for performing this method.

Another object of this invention is to provide a projection exposure method which is suited for mass production of LSIs and which meets the requirements of a wider exposure field and a higher resolution simultaneously by making only minor changes in the configuration of conventional exposure equipment and optical systems.

SUMMARY OF THE INVENTION

In forming a pattern by imaging a circuit pattern of the mask onto a substrate by a projection optics (numerical aperture=NA, reduction ratio=1:M) using light of wavelength $\lambda$, the above objects can be achieved by providing a first grating having a spatial pitch P1 (desirably $\lambda/(1.42 \cdot NA) \leq P1 \leq \lambda/NA$) between the substrate and the projection optics so that it is parallel to the substrate, and by providing an image forming means such as a grating between the projection optics and the mask so that the circuit pattern image is formed near the surface of the substrate by the interference of light diffracted by the first grating. In this case, it is preferable that a first light shielding pattern with a width less than $Z1 \cdot NA$ and a spatial pitch almost equal to $2 \cdot Z1 \cdot NA$ be provided between the substrate and the first grating and a second light shielding pattern to shield an area almost conjugate with the first light shielding pattern be provided immediately above or below the mask, to limit the exposure area. Further, it is preferable that the limited exposure area be exposed by either scanning over the substrate or moving it in steps, as required.

To reconstruct the mask pattern image with great fidelity by the diffracted light from the first grating, a second grating with a spatial pitch P2 (desirably P2 ≦M·P1) is provided between the mask and the projection optics so that it is parallel to the first grating and the mask is irradiated with at least a pair of coherent light beams in two different directions whose incident angle θi is almost sin (θi)=±[λ/(M·P1) +λ/P2]. In that case, it is desirable that the distance Z1 between the first grating and the image plane (ideal image plane) and the distance Z2 between the mask surface and the second grating be set so that Z2=M·(P2/P2)·Z1. To illuminate the mask at the above angle, a third grating whose spatial pitch P3 is almost 1/P3=1/(M·P1)+1/P2 is provided above the mask such that it is parallel to the second grating and a coherent or partially coherent illumination is performed from just above the mask through the third grating. These gratings are preferably phase gratings.

Another way to reconstruct the image of the mask pattern from the light diffracted by the first grating is to provide a second imaging optics, instead of the second and third gratings, between the mask and the projection optics and a fourth grating between the second imaging optics and the projection optics at a position almost conjugate with the first grating, and to illuminate the mask from above. Still another method is to provide the same patterns at two locations on the mask, instead of the second, third and fourth gratings and the second imaging optics, and to illuminate them with coherent light beams from two different directions.

When the mask is illuminated with a pair of coherent mask illumination light beams which have axially symmetric incident angles with respect to the optical axis, the wavefront aberrations of the projection optics are preferably corrected so that the wavefront may be axially symmetric on the pupil plane with respect to the diameter (symmetry axis) perpendicular to the illumination direction. When an alternating phase shift mask is used for the mask, this invention produces a particularly large effect. It is further desirable that the pitch and direction of the fine pattern be restricted or that the pattern shape be compensated for according to the pitch and direction of the grating, as required. Further, it is possible to make patterns finer by filling the gap between the first grating and the substrate with a liquid whose index of refraction n is greater than 1 and setting the NA of the projection optics in the range of 0.5<NA<n/2.

BRIEF DESCRIPTION OF THE DRAWINGS

FIGS. 2a, 2b, 2c and 2d illustrate the imaging carried out by various conventional exposure methods.

FIGS. 3 and 3b illustrate imaging in the case where a phase shift mask or an oblique illumination method is utilized in imaging optics according to the present invention.

FIGS. 5a and 5b show one example of a mask illumination method in optics according to the present invention.

FIGS. 8a and 8b show the imaging optics components and the effects achieved by them in the present invention.

DETAILED DESCRIPTION

This invention provides a grating between the projection optics and the substrate such as a wafer to increase the angle of incidence of a beam striking the wafer surface, thereby producing an effect equivalent to effectively increasing the numerical aperture. Simply providing a grating between the lens of conventional optical system and the wafer, however, has the effect that the diffracted light—which is originally intended to converge on one point on the image plane—is incident at different positions on the image plane, rendering the forming of the mask pattern very difficult. To form an image of the original mask pattern with fidelity, the optical system must be modified. Furthermore, from the viewpoint of practical use, these optical systems preferably should be capable of using conventional masks without any major modification of the projection optics. The present invention satisfies these requirements, as explained in the following.

Figure 1:
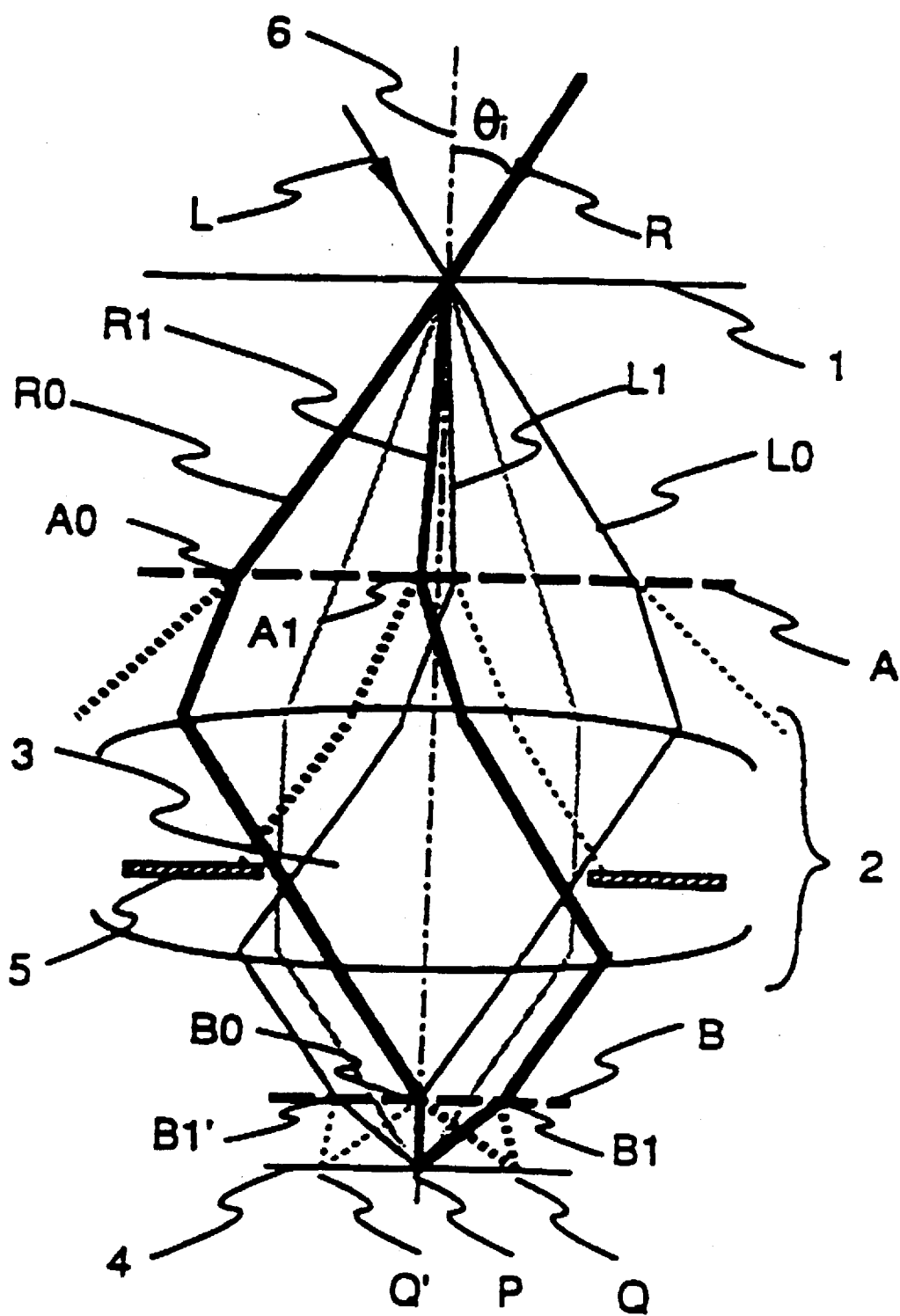
FIG. 1 is a geometric illustration of one embodiment of optics according to the present invention.

To explain the function of this invention, the principle of imaging according to this invention is compared with the conventional method. The imaging performed by the optical system according to one form of this invention is shown in FIG. 1. For comparison, FIGS. 2a, 2b, 2c and 2d show how an image is formed in a conventional reduction projection exposure system when the conventional mask or phase shift mask is illuminated perpendicularly and when it is illuminated obliquely. In either case, a 2:1 reduction imaging optics, coherent illumination and one-dimensional pattern were assumed and the paraxial imaging approximation was adopted.

First, when a normal mask is illuminated perpendicularly with the conventional optical system (FIG. 2a), light 22 perpendicularly incident on a transmission type mask 21 is diffracted by a pattern on the mask. Of the diffracted light, light that has passed through a pupil 24 (inside an aperture 20) of the projection optics 23 converges on an image plane 25 to interfere and form a pattern. Here, assuming that half the pitch of patterns that gives the maximum diffraction angle at which the beam can pass through the pupil be defined as a resolution limit, the resolution limit is given as $\lambda/(2NA)$ (where $NA=\sin\theta_o$). Further, when an alternating phase shift mask 26 is used in this optical system, the zero order diffracted light is eliminated, producing diffracted beams that are symmetric with respect to an optical axis 29 (one-dot chain line), as shown in FIG. 2b. Hence, the maximum relative angle of beams which can pass through the pupil doubles and the resolution limit improves to $\lambda/(4NA)$.

When oblique illumination is applied to a conventional optical system (in FIG. 2c, the zero order light 27 of the mask-diffracted light is assumed to pass through the pupil near its left edge for the sake of simplicity), only one component of the mask-diffracted light, with a positive or negative diffraction angle with respect to the zero order light, (in the figure, +1st order light 28) passes through the pupil and converges on the image plane. Because the diffracted light having a diffraction angle two times that of the perpendicular illumination can pass through the pupil, the resolution limit is $\lambda/(4NA)$. However, because only half the diffraction spectrum is used, the resolution of isolated patterns is not different from the one obtained when the perpendicular illumination is used. Also, in the case of periodic patterns, there is a problem of low contrast. Further, when the mask is changed to an alternate phase shift mask 26, only one of the diffracted beams can pass through the pupil, and thus no pattern is formed (FIG. 2d).

Next, the imaging performed by an optical system based on one form of this invention is shown in FIG. 1. In the optical system of FIG. 1, unlike the conventional optical system of FIGS. 2a to 2d, a grating A is inserted between the mask 1 and the projection optics 2, a grating B is inserted between the projection optics 2 and the wafer 4 and the mask is obliquely illuminated from different directions. Here, both the gratings A and B are assumed to be phase gratings, and the beams R and L from two directions to be coherent with each other.

Of the diffracted light produced when the beam R strikes the mask surface obliquely, let us consider a zero order diffracted beam R0 and a +1st order diffracted beam R1. The zero order diffracted beam R0 reaches a point A0 on the grating A, where the beam is diffracted in the +1st order direction, passes through the pupil 3 near its left edge, reaching a point B0 on the grating B. Then, the beam is diffracted in the +1st order and −1st order directions by the grating B and the diffracted beams arrive at two points Q and P on the image plane. The +1st order diffracted light R1 arrives at a point A1 on the grating A, where it is diffracted in the +1st order direction, passes through the pupil near its right edge (the light diffracted in the −1st order direction is cut off by the aperture 5 in the pupil plane) and then arrives at a point B1 on the grating B. Then, it is diffracted in the +1st order and −1st order directions, reaching the points Q and P on the image plane. Another beam L, having entered the mask, is diffracted and travels along the paths that are symmetric to the diffracted light paths for the incident beam R with respect to the optical axis 6 (the dash—dot line in the figure). That is, the zero order diffracted beam L0 and the −1st order diffracted beam L1, produced when the incident beam L passes through the mask, are diffracted by the grating A and, of these refracted beams, the −1st order beams reach points B0 and B1' on the grating B where they are further diffracted in the +1st and −1st order directions before reaching the points P and Q'. Hence, at the point P, three beams—the zero order beam, +1st order beam and −1st order beam that have been diffracted by the mask—converge. Although FIG. 1 shows the diffracted beams R1, L1 having the maximum diffraction angles at which the beams can pass through the pupil, it is obvious that the diffracted beams with smaller diffraction angles, too, cross each other at the point P at angles corresponding to the diffraction angles. Therefore, at the point P an image is formed with fidelity.

When compared with the conventional method (FIG. 2a), it is seen that the optical system of this invention with the same NA and magnification allows the diffracted light having up to two times the diffraction angle of the conventional system to pass through the pupil. That is, this optical system produces the same effect as obtained when the NA is virtually doubled. Moreover, in the case of oblique illumination, while the conventional optical system can use only the positive or negative half of the angular spectrum with respect to the zero order beam in forming an image on the image plane, this invention uses both halves of the angular spectrum. This allows the resolution of isolated patterns to be improved, which has been difficult to achieve with oblique illumination, and further makes it possible to produce a high contrast for a periodic patterns. Further, the imaging performed when an alternate phase shift mask is used is shown in FIG. 3a. With the zero order diffracted beam eliminated, the +1st order beam R1' and the −1st order beam L1' interfere with each other, so that the critical resolution is $\lambda/(8NA)$, which is half the theoretical limit of $\lambda/(4NA)$ obtained when an alternate phase shift mask and oblique illumination are used. This means that this invention enables significant improvement in the resolution. How an image is formed when oblique illumination is applied in this optical system is shown in FIG. 3b. In this case, the mask illumination beams R and L of FIG. 1 are tilted in the same direction by a predetermined angle and are denoted R" and L". The oblique illumination permits the diffracted beams up to R1" with a large diffraction angel to pass through the pupil, though only on one side, making it possible to improve the resolution by up to a factor of two compared with the resolution of the normal incident illumination, as in the case where the oblique illumination is applied to the conventional optical system. That is, the critical resolution is $\lambda/(8NA)$. By using a variety of illumination beams with different angles of incidence, the effect of partial coherent illumination is produced, just as in the conventional optical system.

Figure 4:
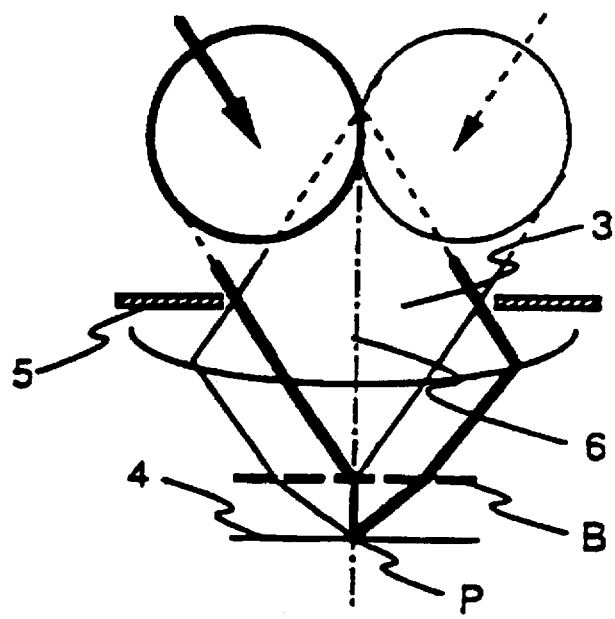
FIGS. 4a and 4b illustrate imaging according to the present invention in terms of Fourier optics.
Figure 4:
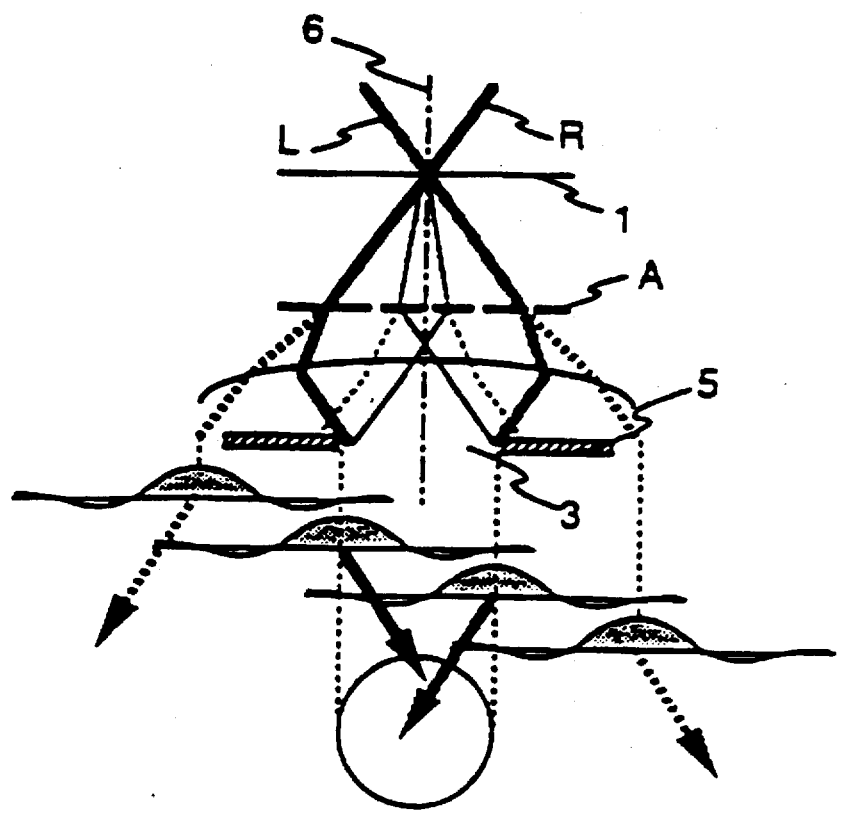

The principle of imaging according to this invention will be explained from the standpoint of Fourier optics as follows (FIG. 4a, 4b). In the following description, assume that the magnification ratio of the optical system is 1 and that the grating is a first order phase grating and only +1st order diffracted beams are considered. When the pupil 3 is viewed from the point P through the grating B, the pupil looks separated into two because of diffraction (FIG. 4a). In each of the pupils a Fourier-transformed image is seen which has passed through the pupil at a specified angle. On the mask side, the beams diffracted by the mask are further diffracted by the grating A and form a plurality of Fourier-transformed images on the pupil plane. Of these beams, those that have passed through the pupil at specified angles form images seen in the pupil (FIG. 4b). That is, the first and third Fourier-transformed mask patterns from the right in FIG. 4a; and the second and fourth Fourier-transformed mask patterns from the right in FIG. 4b are seen in the right-hand side pupil in FIG. 4a. Here, the following two conditions must be met for an image to be formed correctly at point P.

(1) The spectra of the same point on the mask must be seen through the two pupils.

(2) Two spectra must connect to each other continuously at the contact point of the two pupils.

In other words, a single continuous spectrum must be seen through a plurality of pupils.

If, when seen from the image side, a plurality of pupils shifted by f' are seen through the grating B and, in each of the pupils, a plurality of Fourier-transformed mask patterns shifted by f" are seen through the grating A, then the amplitude distribution of a true image u(x) in this invention can be expressed as follows.

$$u(x) = F[\Sigma p(f-f') \cdot \Sigma o(f-f'')]$$

$$f' = \pm SB$$

$$f'' = \pm(SA+SB) - Si$$

where F[] is a Fourier transform, p(f) is a pupil function, o(f) is a Fourier transform of mask patterns, x is a real space coordinate, f is a spatial frequency coordinate, SA and SB are the sines of diffraction angles of gratings A and B, Si is the sine of the incidence angle of the mask illumination beam, and Σ denotes a summation with respect to different illumination angles and diffraction orders. Hence, if we assume $$Si = +(SA+SB),$$

then $$f'' = 0, \text{ or } \pm 2 \cdot (SA+SB)$$

It is therefore possible to obtain a term which leads to f"=0 for both f"=±SB. That is, it is possible to see a single spectrum o(f) through two pupils p(f±SB). Further, to obtain at point P an image for the same point on the mask, the following condition needs to be met.

$$SA \cdot ZA = SB \cdot ZB$$

When the above condition is applied to the optical system with a reduction ratio of M:1 and a numerical aperture on the image side of NA, the pitches PA and PB of the gratings A and B, the mask illumination angle θi, the distance ZA between the mask surface and the grating A, and the distance ZB between the grating B and the ideal image plane are determined roughly as follows.

$$\sin(\theta i) = \pm[\lambda/(M \cdot PB) + \lambda/PA]$$

$$ZA = M \cdot (PA/PB) \cdot ZB$$

Further, to obtain a sufficient improvement in resolution by this invention, the following inequalities should preferably hold.

$$\lambda/NA \leq PB \leq \sqrt{2} \; \lambda/NA$$

$$PA \leq M \cdot PB$$

FIG. 1 represents the specific case where PB=PA/M=λ/NA.

Although there is some freedom in choosing the value of ZB, the exposure field is determined by this value, as described later. To allow the left and right beams on both sides of the zero order beam to interfere with each other on the image plane, it is desirable that the mask illumination beams from the two directions be coherent with each other.

The two coherent beams intersecting at a large angle can be produced by using a grating. This is achieved, as shown in FIG. 5a, by disposing above the mask surface a grating C (phase grating), whose pitch PC is almost 1/PC=1/(M·PB) +1/PA, to project coherent light onto the mask from above. That is, light that emerges at a point on an effective source 51 is virtually collimated by an illumination optics 52 and the collimated light is used to irradiate the mask 1 through the grating C.

The gratings A and C are preferably phase gratings. When the gratings A and C are not perfect phase gratings and allow the zero order light to pass through, the effects of the conventional optical system and oblique illumination optics, both inferior in resolution to this method, are superimposed on the effect of this method. Hence, there is a possibility that the resolution will be degraded. The grating B, on the other hand, may be a phase grating or an amplitude grating. The pitch of the grating B is extremely small and, considering a silicon dioxide film with refractive index of 1.5, the aspect of the ratio grating pattern is nearly 1. In this case, attention needs to be paid to the scattering effect of light at the cross section of the pattern. In the case of a grating having an opaque pattern, the thickness of the opaque film can be reduced substantially, so that the effect of light scattering can be reduced. As described later, however, the use of a phase grating can provide a wider exposure field.

Figure 15:
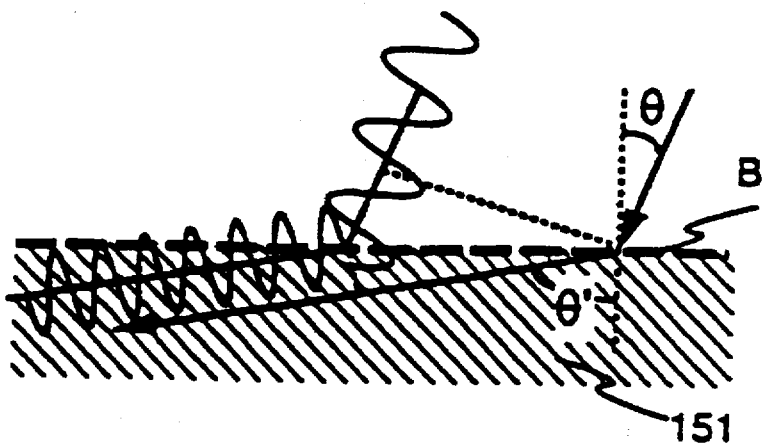
FIGS. 15a and 15b illustrates a section of the imaging optics in apparatus according to the present invention.
Figure 15:
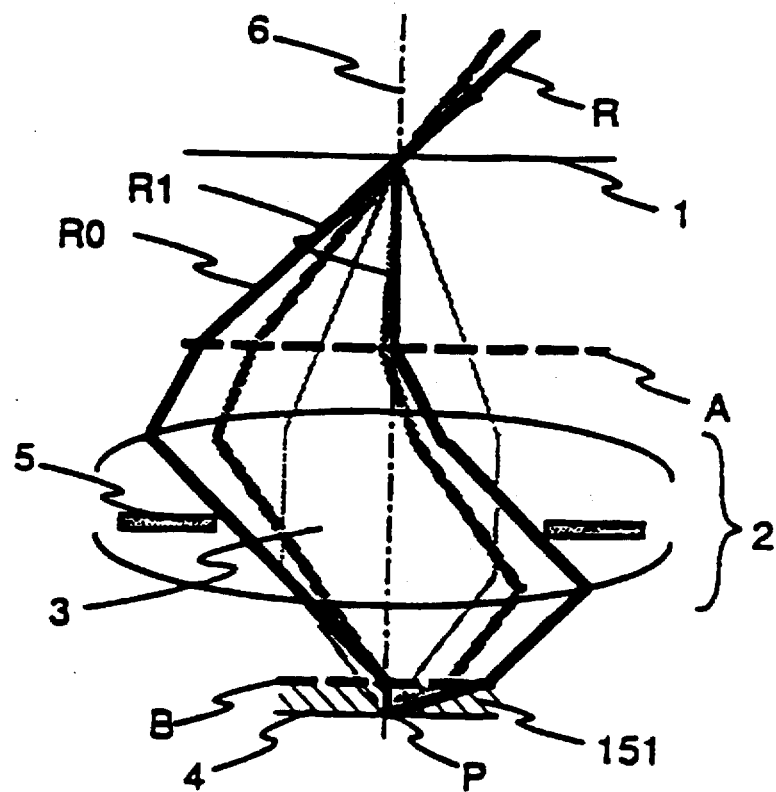

When the substrate side of the grating B is filled with a liquid 151 with a refractive index n greater than 1, the wavelength and the sine of the diffraction angle in this area are decreased to 1/n. If the pitch of the grating is made fine and the diffraction angle is made equal to that obtained when the liquid is not filled, only the wavelength decreases to 1/n, so that the resolution improves to 1/n (FIG. 15a). In this case, on the mask side, it is necessary to increase the mask illumination angle to permit the diffracted light with a greater diffraction angle to pass through the pupil. This, however, prevents the diffracted light with a small diffraction angle from passing through the pupil. To solve this problem, it is desirable that the diameter of the pupil be increased accordingly. This may be explained in another way as follows. When the refractive index between the grating B and the substrate is 1, increasing the NA of the projection optics used in this invention does not contribute to improvement of the resolution at all. This is because, at an angle of sinθ>0.5, the diffraction angle of a beam incident on the grating B with a pitch of λ/NA is larger than 90 degrees with the result that the beam, as an evanescent wave, is localized on the surface of the grating and does not reach the wafer. Letting the refractive index between the grating B and the substrate be n, the diffraction angle θ' of a beam that has entered the grating B at an angle of sinθ=NA (the pitch must be λ/NA in order that the zero order beam, which has passed the edge of the pupil, impinges on the wafer perpendicularly) is given by $$\sin \theta' = (\lambda/PB + \sin \theta)/n = 2NA/n$$

The condition for θ'<90° is NA<n/2. That is, this invention can be applied to optical systems with up to NA=n/2 (FIG. 15b). Liquid immersion optics generally requires special optical design but, if applied to this invention as described above, does not require any special lens. Hence, almost the same effect as produced when the NA is 1.2 can be produced by filling the space between the grating B and the substrate with water (with a refractive index of about 1.3) and performing the exposure using a projection lens with an NA of about 0.6, which is commonly used in semiconductor device manufacturing processes. In this case, too, the use of a phase shift mask leads to a high resolution of less than 0.1 µm even when the i - line wavelength from a mercury lamp is used. With this method, because the incident angles of beams that interfere with each other near the wafer are very large, the image forming performance heavily depends on the polarization of beam. It is generally desirable in forming high contrast images that the beam be polarized such that the electric vector is perpendicular to the plane of incidence.

In the above discussions, it is assumed that the paraxial approximation is performed and the refractive index of the substrate of the grating is 1. Actually, however, it is necessary to consider the effect of the refractive index of the grating substrate and the influences of aberration caused by the grating. Hence, the installation positions of the gratings may be changed slightly as required. It is of course preferable that the direction of periodic patterns of a plurality of gratings be aligned with sufficient precision.

Next, four points to which attention should be paid in this invention will be discussed.

Figure 6:
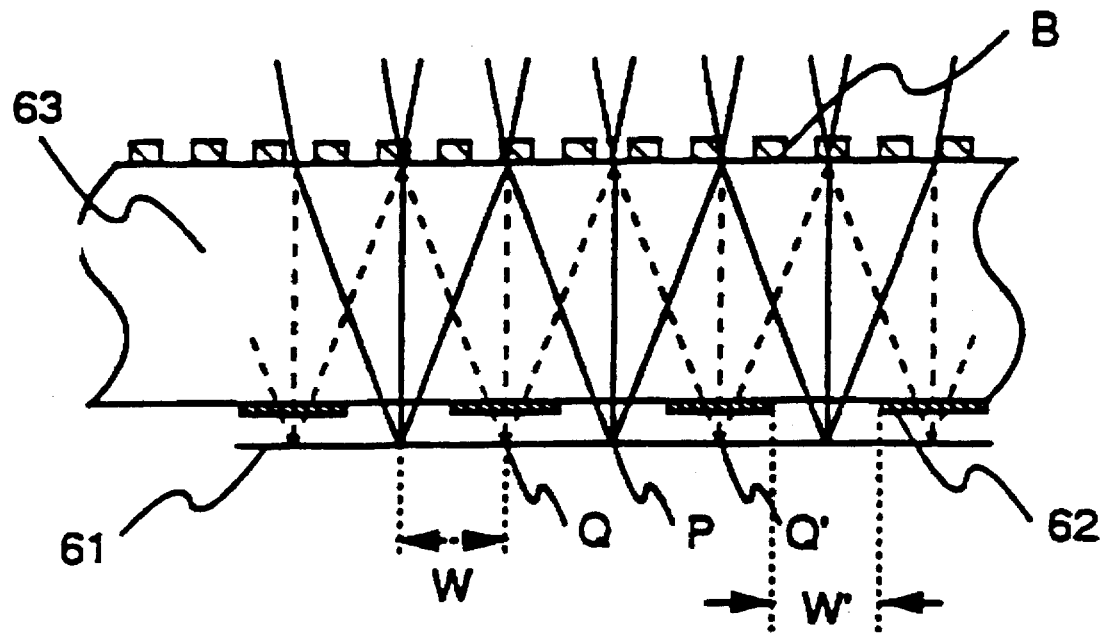
FIGS. 6a and 6b show one example of an exposure method according to the present invention.
Figure 6:
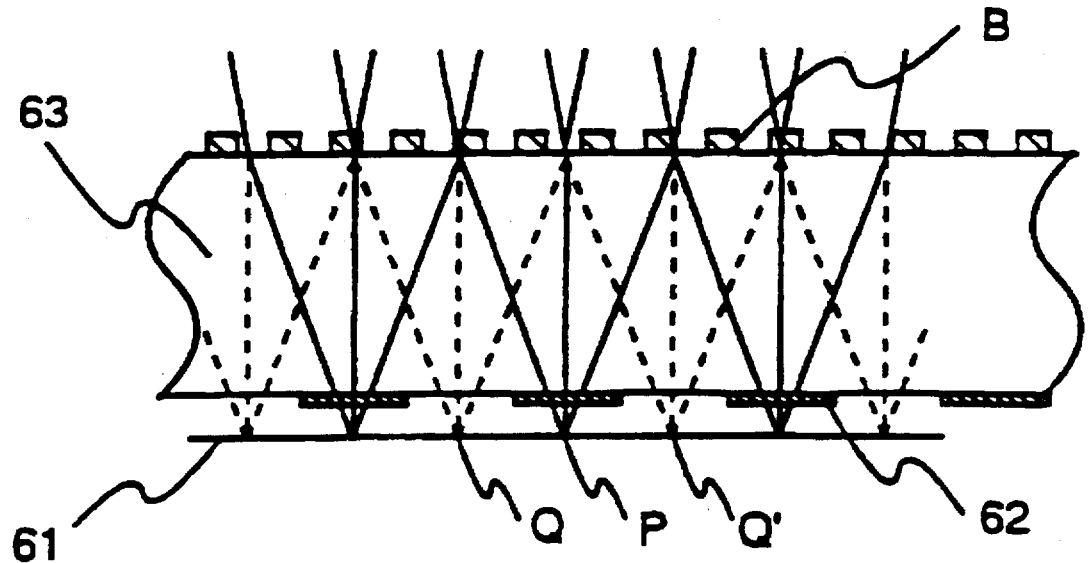

First, when compared with the conventional exposure method, generally the exposure field of this optical system is restricted. As can be seen from FIG. 1, at points Q and Q' on the image plane, too, two beams cross each other and interfere with each other to form an image. This image is an undesired image formed at a position where the image is not intended to be formed. To prevent this, it is preferable in this method that, as shown in FIG. 6a, a light shielding mask 62 be provided just above the image plane 61 (between the wafer and the grating B) to block the undesired image. The grating B and the light shielding mask 62 may be formed on both sides of a quartz substrate 63, as shown in the figure. (They may also be formed on separate substrates.) At the same time, a shielding mask is preferably provided directly above or below the mask to shield the area virtually conjugate with the light shielding mask. Alternatively, the mask illumination area is preferably limited to the conjugate area. The exposure field that can be transferred by a single exposure appears repetitively in a region corresponding to the distance (approximately 2NAZB) between the desired image (point P) and the undesired image (point Q) at a pitch two times the distance. Hence, when the area which can be exposed is narrower than the total area to be exposed, it is desirable that, as shown in FIG. 6b, the exposure field be scanned over the wafer. In this case, if the reduction ratio of the optical system is M:1, the ratio of the mask scan speed to the wafer scan speed should accurately be set at M:1. As the method for scanning the exposure field over the mask and the wafer in synchronism, the method used for existing exposure equipment can be used as is. If, on the other hand the area which can be exposed is greater than the total area to be exposed, that is, if the distance between the desired image and the undesired image covers, for instance, one chip, the exposure can be done without performing a scan. The size of the exposure field is determined by the installation position of the grating B and, the farther the grating B is from the image plane, the greater the width of a single exposure field becomes. At the same time, the width of the untransferable area also increases, so that the ratio 1:1 of these two areas remains unchanged. To eliminate the influence of the undesired image, it is desirable that the width W of the exposure field on the wafer be W≦NAZB. When the grating B is an amplitude grating, the zero order diffracted beam of the grating forms another undesired image at an intermediate point between the desired image and the undesired image, making the exposure field almost half of that obtained with a phase grating.

Second, this method generally degrades the exposure intensity. In this method, of the beams diffracted by one of the gratings inserted in the optical system, only beams of a particular diffraction order are used to form an image on the wafer. Hence, each time the beam passes through a grating, the intensity of the beam that contributes to the exposure decreases. Further, the fact that the exposure field is limited on the mask and the wafer, as described above, also is a cause of reduction in throughput. Hence, this method desirably employ such measures as use of a light source with sufficient intensity and use of a resist material such as highly sensitive chemically amplified resist.

Third, as explained before, on the pupil plane a Fourier-transformed image shifted by f'=±2(SA+SB) is formed, in addition to a desired diffraction image with f''=0. That is, the higher order spectrum of the Fourier-transformed image (the outer two images of the four images of the Fourier-transform of the mask patterns in FIG. 4b) overlaps the spectrum of the intended image (the central two images of the four images of Fourier-transform of mask patterns of FIG. 4b). This is equivalent to the diffracted beam with its diffraction angle θ in the range θi<θ<2θi entering the image plane at an angle of θi-θ from a direction symmetric, with respect to the optical axis, to a diffracted beam with θ<θi of FIG. 1. In this case, the spectrum component in the range of $2NA/\lambda < f < 4NA/\lambda$ in the spatial frequency spectrum of the mask pattern is folded at the spatial frequency of $f=2NA/\lambda$ to overlap the spectrum in the range of $0<f<2NA/\lambda$, with the result that the higher order spectrum virtually shifts to the lower spatial frequency. Although higher order spectrum components generally have a low intensity and therefore small influences, they have the potential of generating light intensity fluctuations at large spatial pitches on the wafer surface. This effect is mitigated by widening to a certain extent the distribution of illumination angles of the two mask illumination beams. This is because as the angle of incidence of the illumination beam changes, so does the spatial frequency at which the high order spectrum component is produced, and the period of the low frequency fluctuations are averaged. To widen the distribution of illumination angles of the two mask illumination beams, the light illuminating the grating C arranged above the mask needs to be partially coherent light, as shown in FIG. 5b. That is, as used in the ordinary projection exposure equipment, the secondary light source is provided as a set of point sources of incoherent light having a spatial expanse on that plane of the secondary light source which constitutes the Fourier plane of the mask.

In the above explanation, it is assumed that the illumination beams from two different directions coherent with each other. When the illuminating beams are incoherent having no interference with each other at all, this method can only produce an effect almost identical to that of the conventional oblique illumination method. That is, the positive or negative half of the angular spectrum with respect to the zero order beam contributes to the formation of an image. The illumination beams used in actual lithography, however, are at least partially coherent, so that provision of a grating produces an effect equivalent to the effect of increasing the NA compared with the conventional method. The higher the degree of coherence of the illumination beam, the greater the effect of increased NA. Hence, when the interference between ±1st-order diffracted beams is used as in the case using the alternating phase shift mask, the beams are desirably coherent with each other.

Figure 7A:
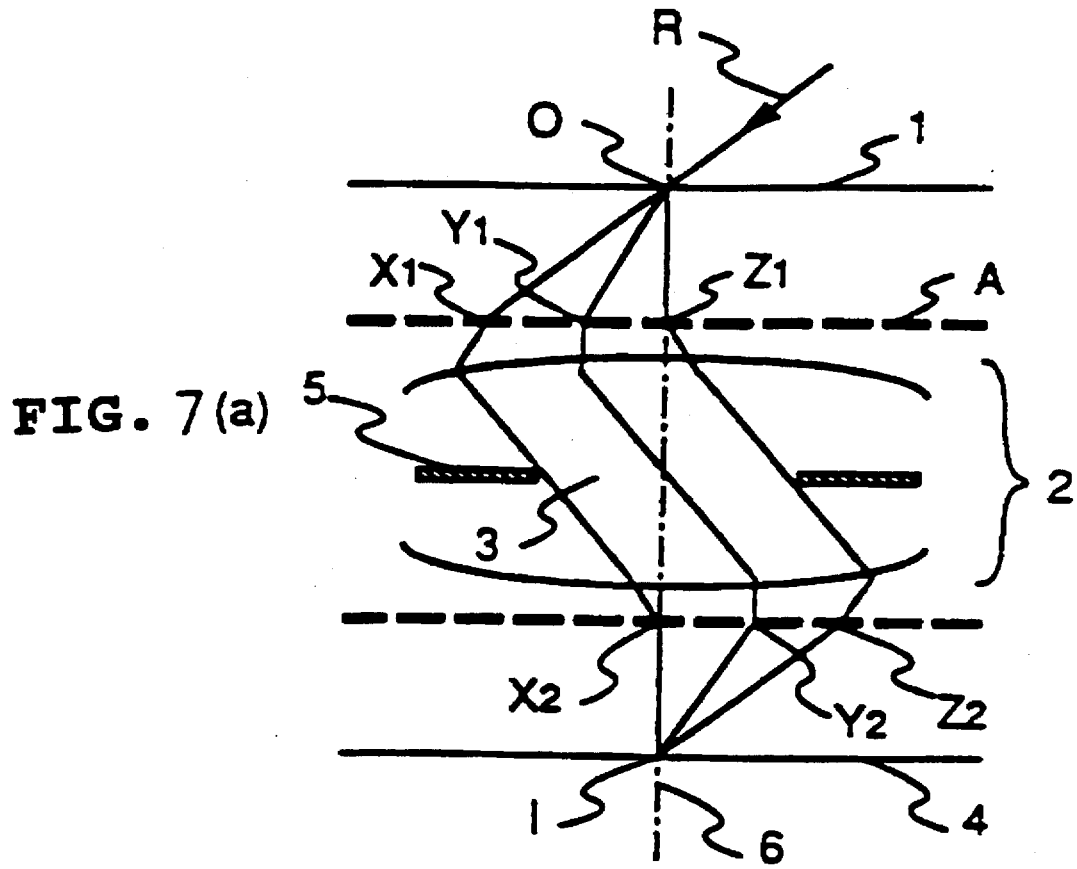
FIG. 7a is a section of imaging optics according to the present invention.
Figure 7B:
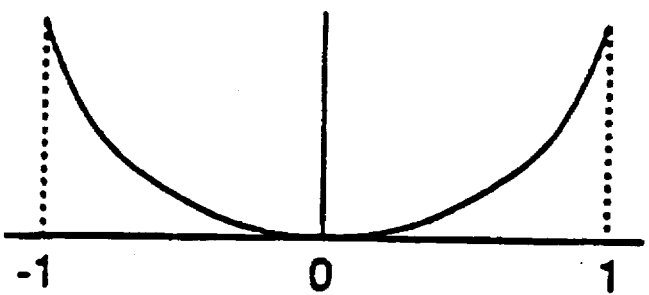
FIG. 7b is a figure showing the characteristics of imaging optics according to the present invention.

Fourth, the optical system of this invention has the possibility of generating wavefront aberrations because of the gratings introduced in the projection optics. The wavefront aberration produced by the grating will be explained referring to FIG. 7a and 7b. For the optical system of FIG. 7a to have no aberration, the difference in optical path length between the paths $OX_1X_2I$, $OY_1Y_2I$ and $OZ_1Z_2I$ must be zero. Any difference in the optical path length among these results in wavefront aberration. Here, let us assume that the projection optics is an ideal optical system having zero wavefront aberration. Because $X_1X_2=Y_1Y_2=Z_1Z_2$, we need only to consider the path length difference between $OX_1+X_2I$, $OY_1+Y_2I$ and $OZ_1+Z_2I$. If the reduction ratio M is unity, two triangles $OX_1Z_1$ and $IX_2Z_2$ are congruent and therefore the wavefront aberration of the beams passing through the pupil is symmetric (in the plane $X_1Z_1Z_2X_2$) with respect to the beam $OY_1Y_2I$ that passes through the center of the pupil. Hence, this wavefront aberration can be corrected in the design phase of the projection optics. When, on the other hand, the reduction ratio M is not unity, the wavefront aberration in the pupil plane for beams illuminating the mask at certain angles is generally nonsymmetric. In the optical system of FIG. 1, because the mask needs to be illuminated from at least two different directions, correcting the aberrations for the illumination beams from two directions simultaneously by the projection optics becomes difficult. In this case, the wavefront aberration should preferably be corrected either between the mask and the projection optics or between the projection optics and the wafer. These corrections can be made by, for example, by inserting an optically flat, transparent plate with an appropriate thickness and an appropriate refractive index. In this way, by making the wavefront aberration for an illumination beam incident in one direction axially symmetric on the pupil with respect to the axis perpendicular to the illumination direction, it is possible to correct the wavefront aberrations for a pair of opposing illumination angles at the same time.

Figure 9:
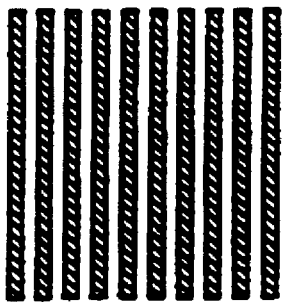
FIGS. 9a, 9b and 9c show further imaging optics components and the effects achieved by them in accordance with the present invention.
Figure 9:
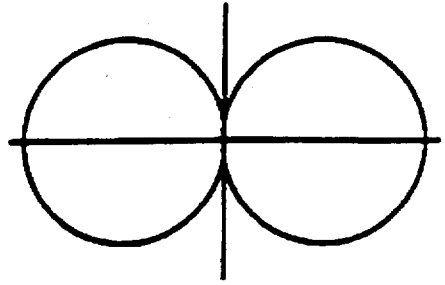
Figure 9:
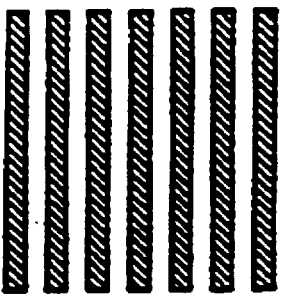
Figure 9:
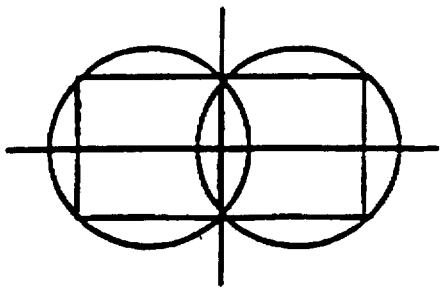
Figure 9:
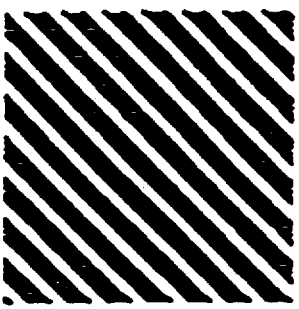
Figure 9:
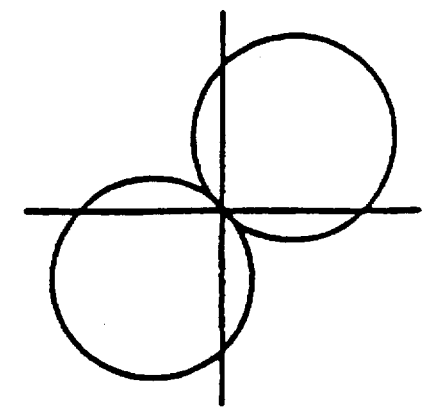

The use of a one-dimensional pattern as the mask pattern has been described for simplicity. In practice, however, a two-dimensional pattern needs to be examined. To produce the effect of this invention for all directions, the gratings need to be two-dimensional gratings, as shown in FIG. 8a and 8b. In this case, the illumination and the apparent pupil shape are four-fold symmetric. Simultaneously correcting the wavefront aberrations on the pupil for two sets of perpendicularly crossing illumination beams, however, is difficult for the reasons mentioned above. It is therefore somewhat difficult to produce the effect of this invention equally for all directions on the mask, and in practice, a method employing gratings and pupils as shown in FIG. 9 may be used. FIG. 9a, 9b and 9c show three representative gratings and apparent pupil shapes. In FIG. 9a, the apparent NA increases by nearly a factor of two for x-direction patterns but decreases for y-direction patterns. In FIG. 9b, the apparent NA increases by a factor of $\sqrt{2}$ for x-direction patterns and decreases $\sqrt{2}$ for y-direction patterns. In FIG. 9c, the NA increases by $\sqrt{2}$ for both x- and y-direction patterns but the imaging performance in the direction other than the x and y directions depends heavily on the pattern direction. In either case, it is desirable that some directional limitations be imposed on the design rule of mask pattern.

To eliminate the dependence of the imaging performance on the pattern direction, the arrangements of FIG. 9a, 9b and 9c may be rotated through 90 degrees to perform multiple exposure. Particularly when this is applied to FIG. 9c, it is possible to limit the imaging performance dependence on the pattern direction in the direction other than the x and y directions and to produce an image equivalent to that formed when the NA is increased by $\sqrt{2}$ in both x and y directions, without sacrificing the image contrast. It is noted, however, that rotating the grating by 90 degrees causes the aberration characteristics to rotate by 90 degrees as well. Hence, the aberration correction is made desirably by using a pupil function, which is rotated through 90 degrees together with the grating. When the aberration correction is difficult, a slit aperture may be provided in the pupil plane, as required.

Figure 3:
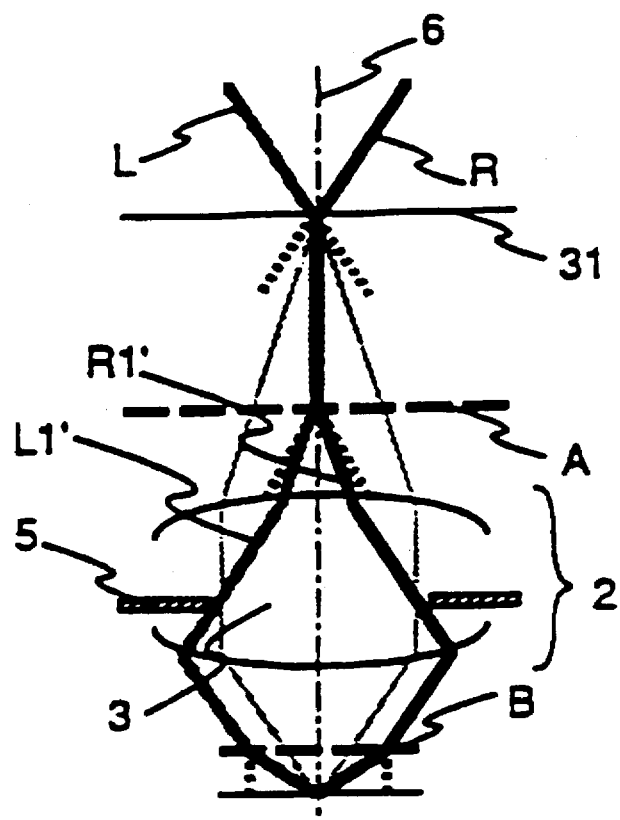
Figure 3:
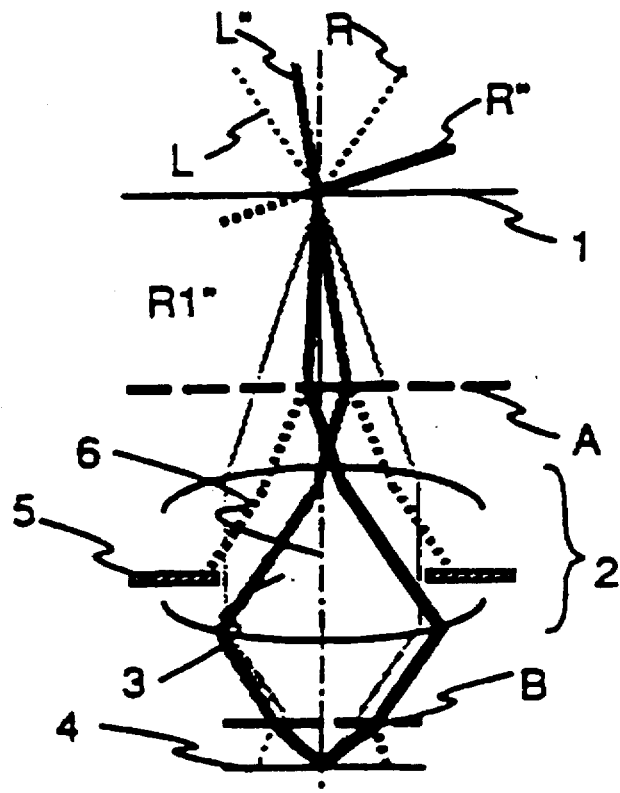

When, as shown in FIG. 3, the alternating phase shift mask is illuminated with completely coherent beams at symmetrical angles from left and right (when the illuminating system of FIG. 5a is used), the paths of the ±1st order beams that interfere with each other near the wafer are always symmetrical with respect to the optical axis and their optical path lengths are equal. Hence, fine patterns can be formed even when the wavefront aberration of the optical system is not corrected. That is, when an alternating phase shift mask is used under completely coherent illumination, a two-dimensional grating such as shown in FIG. 8 can be used, making the most of the effect of the phase shift mask regardless of the pattern direction. When a mask pattern having a variety of patterns is to be transferred, only the fine periodic patterns are exposed by the above-mentioned method, and then the rest is exposed by the conventional method.

Generally, the above wavefront aberration sharply increases with the value of NA. In optical systems with the NA in the range of 0.1 to 0.2, the wavefront aberration is not a big problem. Hence, when this invention is applied to a large-area exposure equipment with a low NA and a low magnification ratio, or a reflective type soft X-ray reduction projection exposure system, the above-mentioned various limitations can be mitigated.

According to the invention, the left and right halves of the Fourier-transformed mask pattern with respect to the zero order diffracted beam, are made to pass through the pupil separately, and are combined on the image side. Although this idea has already been applied to optical microscopes as mentioned in the literature cited above, no proposal has yet been made with regard to the application of the idea to the configuration of an optical system in reduction projection optics. This invention realizes this in a reduction projection exposure system. That is, the optical system of FIG. 1 has a grating between the projection optics and the wafer to increase the angle of incidence of the beam entering the wafer surface so that the diffracted beams interfere with each other close to the wafer surface, thereby forming an image that closely resembles the original mask pattern.

The optical system theat realizes this effect is not limited to the embodiment of FIG. 1 and other embodiments are possible. Other embodiments of this invention are shown in FIG. 10 and 11.

Figure 10:
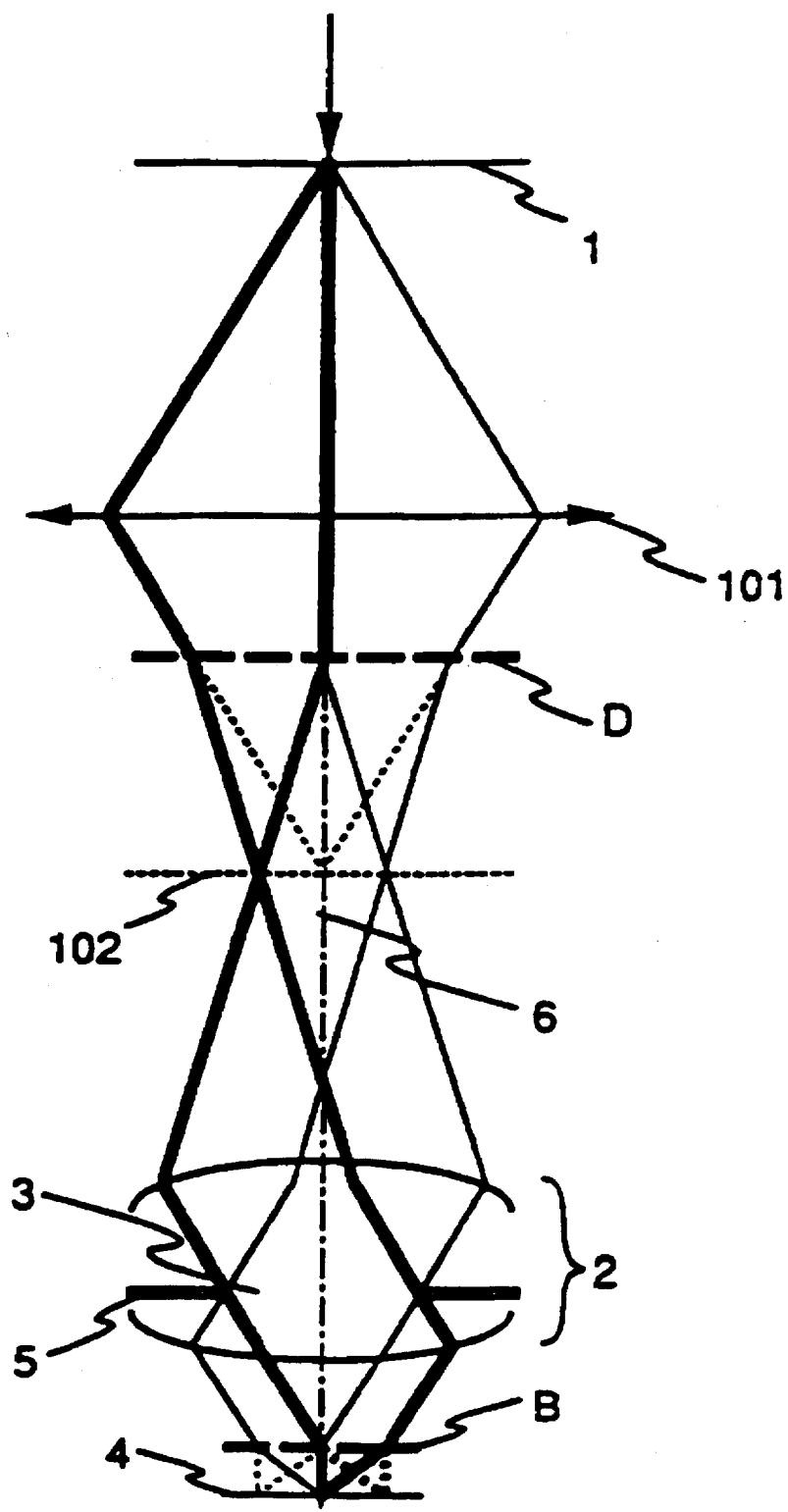
FIG. 10 illustrates another embodiment of imaging optics according to the present invention.

FIG. 10 shows a configuration in which, instead of the grating A of FIG. 1 between the mask and the projection optics, a second imaging system 101 and a grating D are provided between the mask and the projection optics. This system is a relay optical system that links the mask and the wafer surface through a mask conjugate surface 102. The grating D is disposed between the second imaging optics and the original projection optics at a position almost conjugate with the grating B. The mask is exposed with coherent illumination in an almost vertical direction. In principle, this method can completely suppress the wavefront aberration generated between the grating A and the substrate by means of the second imaging optics and therefore allows the two-dimensional arrangement of the pupil as shown in FIG. 8a and 8b. This method, however, has a drawback that the optical system becomes complex.

Figure 11:
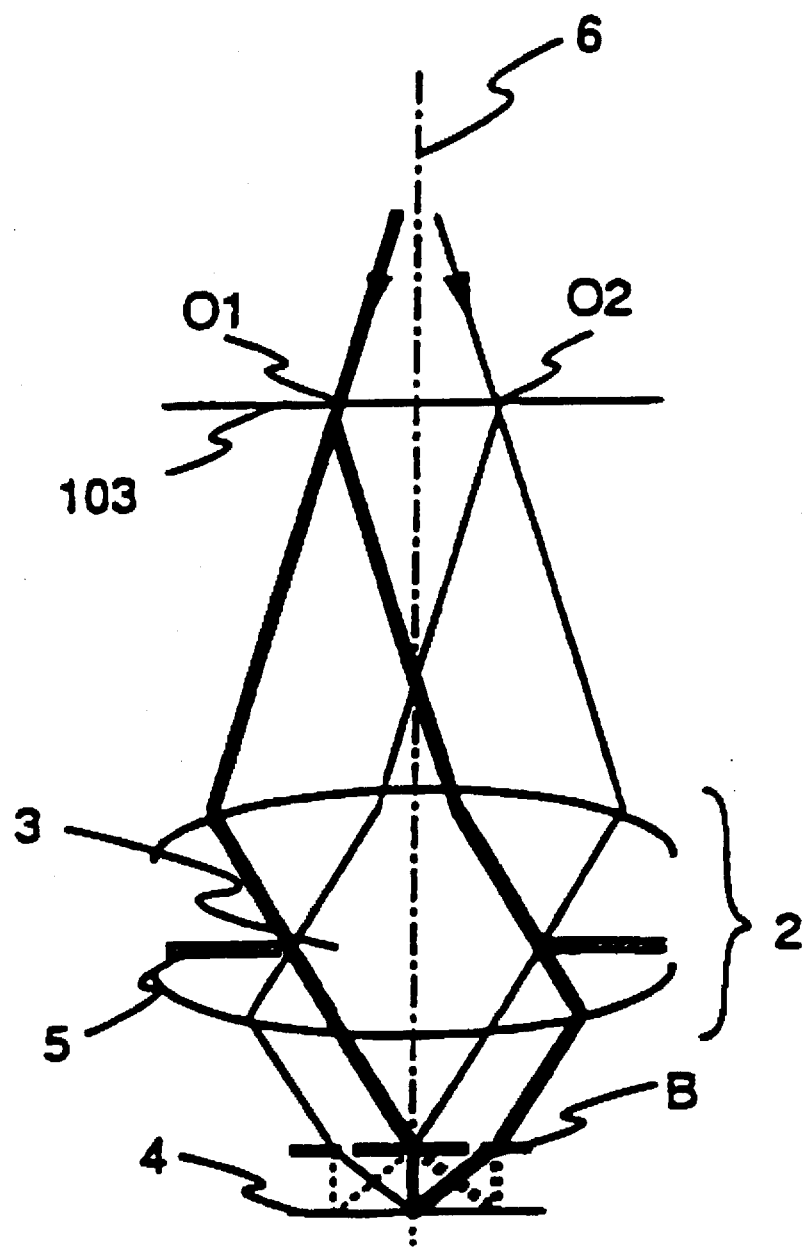
FIG. 11 illustrates still another embodiment of imaging optics according to the present invention.

FIG. 11 shows another configuration in which the grating A of FIG. 1 is removed, the mask is changed to a split mask 103 having the same patterns at two locations 01 and 02, and these two patterns are exposed to coherent beams from directions shown in the figure. A prism (not shown) may be used for coherent illumination of two different points from different directions. The disadvantage of this optical system is that it requires two patterns on the mask to expose a single pattern and therefore two masks must be superposed to expose one circuit pattern. Another problem is that the correction of wavefront aberrations is extremely difficult. Because the behavior of the diffracted beams on the image side is exactly the same as that of FIG. 1, it is obvious that a similar effect to that of the optical system of FIG. 1 can be produced by either of the above methods. The optical system of FIG. 1, however, overcomes many drawbacks of these other modes simply by providing a grating between the mask and the projection optics and therefore is more practical than any of the other methods.

This invention can be applied to a variety of projection optics, such as refractive optics, reflective optics, a combination of both, reduction optics, and unity magnification optics. As methods for the exposure of the mask pattern onto the wafer using the optical systems, this invention can be applied to any of full wafer exposure, scan exposure, step and repeat exposure, and step and scan exposure. As can be seen from the above explanation, this invention is based purely on the effect of geometric optics and therefore does not result in any problems that would arise from the use of evanescent light as in the method using the Moire pattern. Furthermore, because the grating can be installed separately from the wafer and there is no need to perform synchronous scanning, this invention is much easier to realize than the previously known methods.

EXAMPLES The following are examples of embodiments which can be constructed in accordance with this invention.

Embodiment 1

Figure 12:
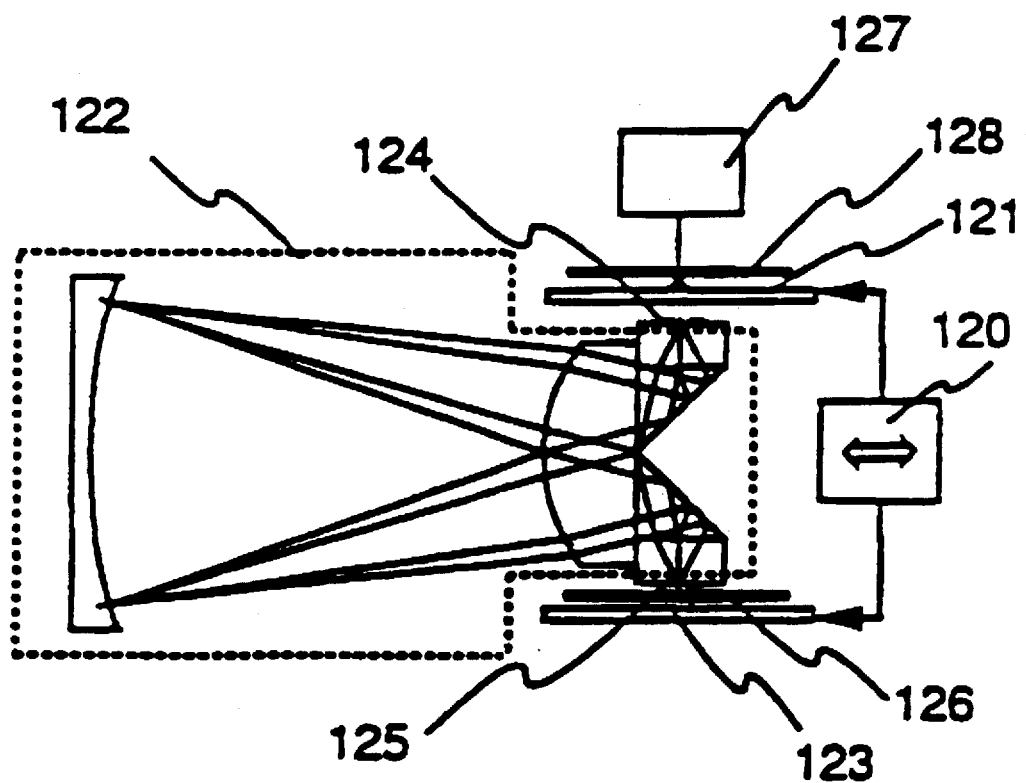
FIG. 12 is a schematic view showing the structure of an embodiment of exposure equipment constructed according to the present invention.

A projection exposure system using a 1:1 Dyson optics (NA=0.4, exposure wavelength $\lambda$=365 nm) is modified based on this invention as shown in FIG. 12. A mask 121 is projected through a projection optics 122 onto a wafer 123 mounted on a wafer stage 134. Phase grating patterns 124, 125 are put on the surface facing the mask 121 of the projection optics 122 and on the surface facing the wafer 123, respectively. Between the phase grating pattern 125 and the wafer a mask plate 126 is disposed that limits the exposure field by a periodic opaque pattern. A transparent quartz plate 128, which has a periodic opaque pattern on one side and a phase grating pattern on the other side, is inserted between the illumination optics 127 and the mask in such a way that the periodic opaque pattern side faces the mask. The phase grating patterns 124 and 125 are silicon dioxide film patterns with a pitch of $\lambda/NA$ and the phase grating pattern on the transparent quartz plate 128 is a silicon dioxide film pattern with a pitch of $\lambda/(2NA)$. The thickness of the silicon oxide film is set so that the beams that pass through a portion where the film is not present and a portion where the film is present are 180 degrees out of phase with each other. The opaque patterns on the mask plate 126 and the transparent quartz plate 128 are Cr patterns with a pitch of 50 μm and set so that their opaque portions may be conjugate with each other. These patterns can be formed by electron beam lithography. For correction of wavefront aberration caused by the insertion of the mask plate 126, the positions of the mirror and the lens in the Dyson optics are adjusted. The exposure is performed by scanning the mask and the wafer in the same direction and at a constant speed. The scanning and exposure are controlled by signals from the exposure controller 120.

Embodiment 2

Figure 13:
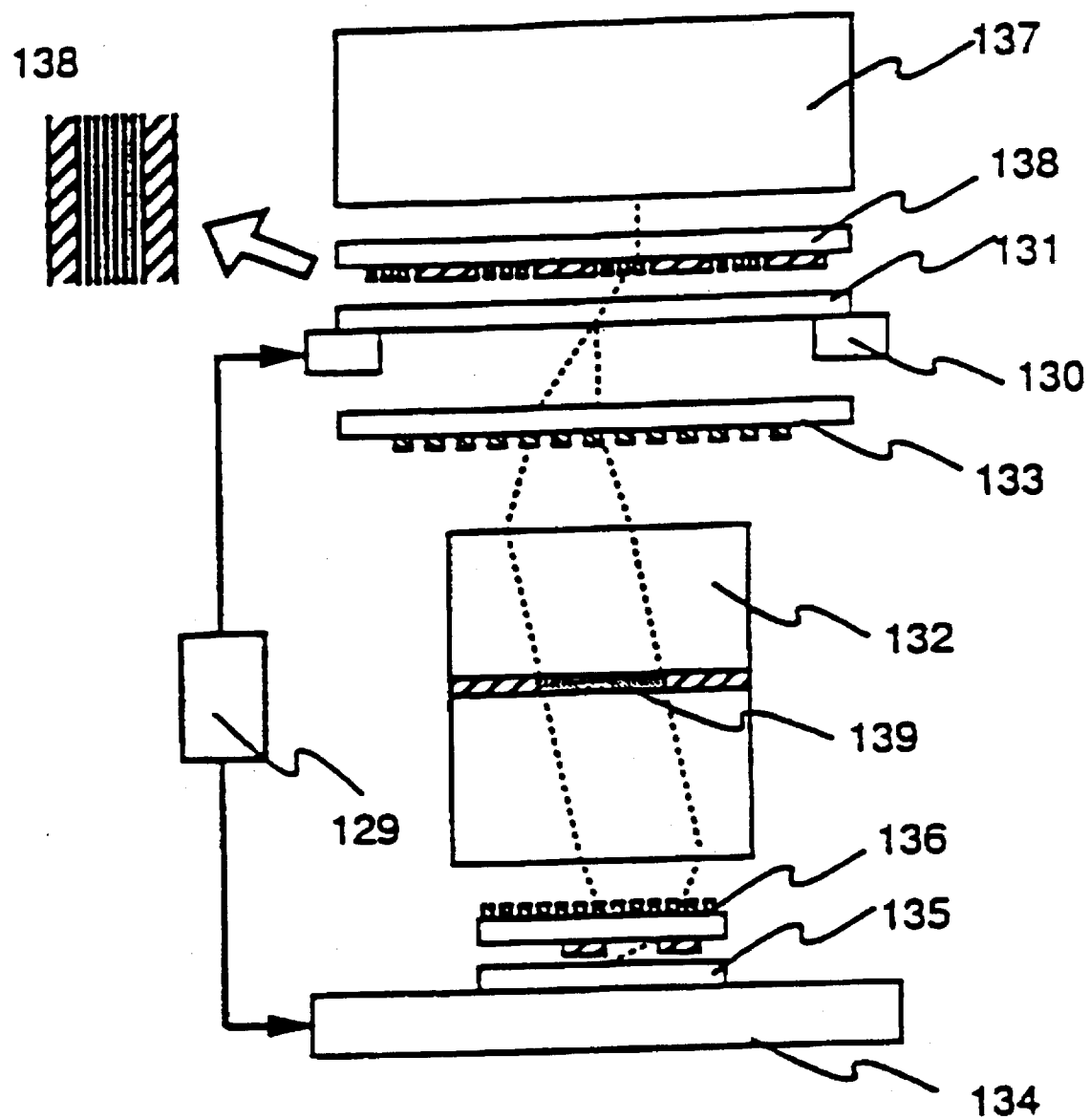
FIG. 13 is a schematic view showing the structure of another embodiment of exposure equipment constructed according to the present invention also showing the pattern on a quartz plate used therein.

A scan type KrF excimer laser projection exposure system with NA=0.6, source wavelength $\lambda$=248 nm and reduction ratio of 4:1 is modified according to this invention as schematically shown in FIG. 13. First, a transparent quartz plate 133 having a phase grating pattern is inserted between a mask 131 placed on the mask stage 130 and a projection optics 132. A transparent quartz plate 136 having an opaque pattern on one side and a phase grating pattern on the other is inserted between a wafer 135 mounted on the wafer stage 134 and a projection optics 132 so that the opaque pattern side faces the wafer. The opaque pattern is a Cr pattern with a pitch of 20 μm and the phase grating pattern is a silicon dioxide film pattern with a pitch of $\sqrt{2}\cdot\lambda/NA$. The pitch of the phase grating pattern on the mask side is four times that on the wafer side. The thickness of the silicon oxide is such that the beams that pass through a portion where the film is not present and a portion where the film is present are a 180 degrees out of phase with each other. Provided on the mask, on the illumination optics 137 side, is a transparent quartz plate 138 that has on the same side a phase grating pattern and an opaque pattern both with a pitch of $\lambda/(\sqrt{2}\cdot NA)$. (The plan view of the pattern on the transparent quartz plate 138 is shown in FIG. 13. The shaded part is the opaque part and the dotted part is the phase shift part.) The installation position of the transparent quartz plate 138 and the pitch and width of the opaque pattern are determined so that the illumination region of the mask is conjugate with the transmission region of the opaque pattern on the transparent quartz plate 136. These patterns can be formed by electron beam lithography in a manner similar to the process of making ordinary masks or so-called chromeless phase shift masks. Further, for correcting the wavefront aberrations, a wavefront aberration correction filter 139 is inserted at the pupil position in the projection optics. The wavefront aberration correction filter 139 is mainly for correcting the astigmatism in a direction perpendicular to the direction of pitch of the grating. The projection optics itself may be aberration corrected beforehand with respect to the grating. In this case, no aberration correction filter is needed. The transparent quartz plates carrying the gratings and the aberration correction filter are replaceable and can be set in predetermined positions. For accurate positioning of the transparent quartz plates, the plate holders (not shown), and measure the positions of the quartz substrates and set them to desired positions. Further, an autofocus monitor (not shown) provided on the wafer stage 134 monitors the image and feeds back the monitored image so that the positions of the quartz substrates can be adjusted to produce optimum imaging characteristics in the image plane.

The exposure is done by performing asynchronous scan of the mask and the wafer. The stage controller 129 controls the movement of the mask stage 130 and the wafer stage 134 at a speed ratio of 4:1 to perform the synchronous scan.

Embodiment 3

Figure 14:
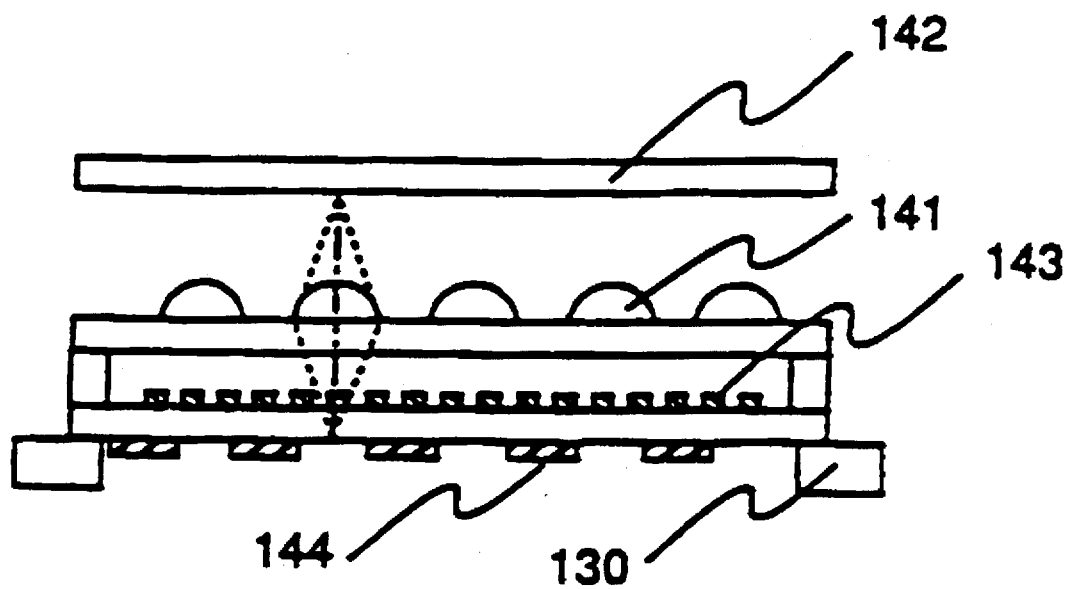
FIG. 14 is a schematic view showing the structure of a further embodiment exposure equipment constructed according to the present invention.

In the KrF reduction projection exposure system similar to the Embodiment 2, a combination of an optical system and a mask, shown schematically in FIG. 14, is mounted, instead of the mask 131, on the mask stage 130. Further, the phase gratings immediately above and below the mask and the transparent quartz plates 133 and 138 having an opaque pattern are removed. In FIG. 14, a microlens array 141 forms an image of a mask 142 on a surface having an opaque pattern 144, through a phase grating 143. The microlens array 141, the phase grating 143 and opaque pattern 144 are assembled, and the opaque pattern surface is placed on the mask stage 130. Hence, the image of the mask 142 formed through the phase grating 143 is located in the object plane (which almost coincides with the upper surface of the mask stage 130) of the reduction projection exposure system. As in other embodiments, a phase grating is provided between the wafer and the projection exposure optics. The pitch of the microlens array and the pitch of the opaque pattern exposure field are set equal so that one microlens covers one exposure field on the mask. The mask pattern is divided into subfields at the pitch of the array and the desired patterns in the subfields are inverted. These subfields are arranged at the pitch of the array. The working distance and the exposure field of each microlens has to be small enough that the microlens aberrations are sufficiently small. This embodiment brings about a resolution improving effect similar to that of Embodiment 2.

In the above embodiments, the kind of optics, the NA, the source wavelength, the reduction ratio, the kind and size of resist and mask pattern, and the pitch and installation position of grating and opaque pattern are accurately specified. Various modifications may be made to these conditions without departing from the spirit of this invention.

Embodiment 4

Figure 16:
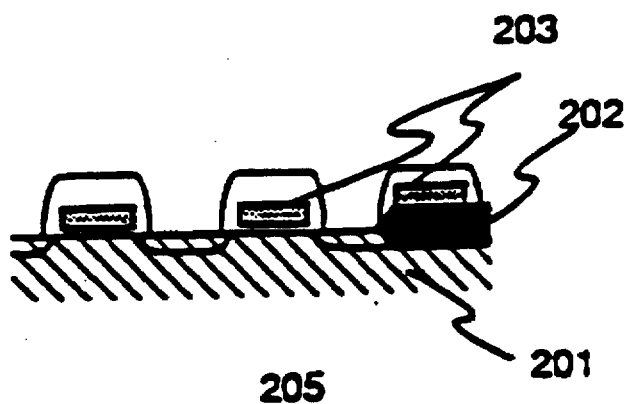
FIGS. 16a, 16b and 16c illustrate making circuit patterns using an embodiment in accordance with the present invention.
Figure 16:
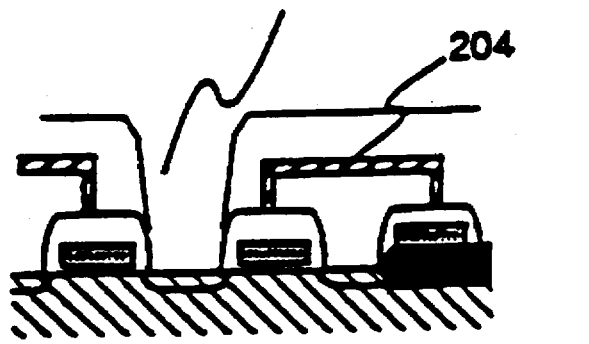
Figure 16:
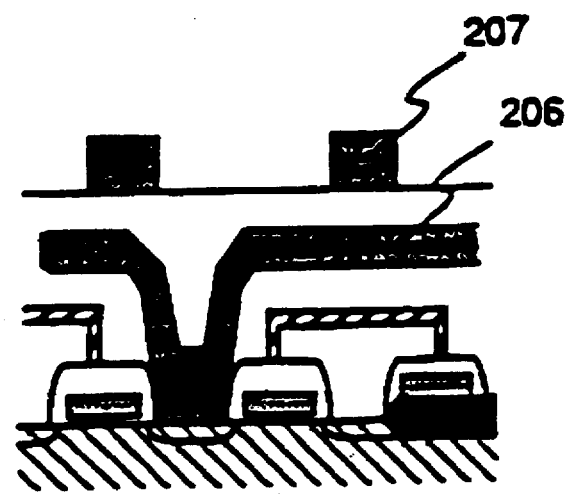

Next, an example of making a DRAM with a design rule of 0.1 μm by using the exposure equipment of Embodiment 2 will be described. FIG. 16 shows the process of making the device concentrating on the exposure process.

First, an isolation region 202 and a gate 203 are formed on a silicon substrate 201 in which wells (not shown) are already formed (FIG. 16a). The isolation region and gate pattern are projected by the exposure equipment of Embodiment 3 using an alternating phase shift mask. Here, because a phenomenon causing the pattern shape to become distorted at the periphery of the periodic pattern was predicted from the results of simulations, a mask for removing this unwanted distorted portion is prepared. The same resist film is exposed again with this mask by using conventional exposure equipment, and then developed. The unwanted portions in terms of circuit performance are thus removed. It is also possible for the unwanted portions to remain as they are and to ignore them with respect to the circuit.

Next, capacitors 204 and contact holes 205 are formed (FIG. 16b). The pattern exposure of the contact hole is done by using an electron beam direct writing method. Next, a first layer wiring 206, via holes (not shown) and a second layer wiring 207 are formed (FIG. 16c). The first layer wiring (0.1 μm L/S) is exposed by using an alternate phase shift mask and an exposure equipment shown in the Embodiment 2. Here, the direction and size of the gratings are changed to those shown in FIG. 9c and the gratings are turned through 90 degrees for multiple exposure. At the same time, the aberration correction filter 139, too, is rotated by 90 degrees along with the gratings. With this arrangement, 0.1 μm lines and spaces (L/S) can be formed without any dependence on direction for the wirings extending in both longitudinal the and lateral directions. Formation of via holes is done by using the electron beam direct writing method similarly to the formation of the contact holes.

Subsequent patterns of multilevel interconnections and a final passivation pattern are designed with a 0.2 μm design rule and formed using an ordinary KrF excimer laser projection exposure method that is not modified according to this invention. It is noted that the kind, structure and material of the circuit patterns may be changed from those used in this embodiment.

Embodiment 5

Next, another embodiment of this invention applied to the manufacture of a distributed feedback (DFB) laser will be described. The exposure equipment used is an ArF excimer laser reduction projection exposure system with an NA of 0.5, modified as in the Embodiment 2. The grating with a pitch of 140 nm, which is conventionally formed by using the electron beam writing method in the ¼-wavelength shift DFB laser fabrication process, is here formed by using an alternate phase shift mask and the above-mentioned exposure equipment. This arrangement allows the DFB laser with almost the same performance as that manufactured by using the electron beam writing method to be manufactured in a shorter period of time.

Thus, according to the invention, in forming a pattern by illuminating a mask through the illumination optics and imaging the mask pattern on the substrate by the projection optics, a grating is provided between the substrate and the projection optics so that it is parallel to the substrate, and a grating or an imaging optics is provided between the projection optics and the mask or between the mask and the illumination optics so as to reconstruct the image of the mask pattern near the substrate surface by the interference of beams diffracted by the grating. This arrangement allows a fine pattern, which exceeds the resolution limit of the conventional exposure equipment, to be formed. Specifically, it is possible to produce almost the same effect as that obtained when the NA is increased by up to a factor of two, without actually changing the NA of the projection optics. This results in a large exposure field and high resolution without requiring any drastic change in the fundamental construction of the optical system, or in the conventional exposure equipment, making it possible to manufacture LSIs with design rules of about 0.1 μm by using reduction projection photolithography suited for mass production.

What is claimed:

1. A projection exposure method for forming patterns on a substrate comprising:

a) applying light of wavelength (λ) emitted from a light source, onto a mask having a pattern, through illumination optics;

b) imaging the pattern on the mask onto the substrate utilizing projection optics with a reduction ratio of M:1 and a numerical aperture of NA; and c) forming an image of the mask pattern, by means of light diffracted by a first grating, positioned between the substrate and the projection optics, parallel to the substrate, interfering on a nearby substrate surface.

2. A projection exposure method, according to claim 1 comprising inserting a second grating or an imaging optics between the mask and the illumination optics, or between the projection optics and the mask, such that the image of the mask pattern is formed at said nearby substrate surface from the interference of light diffracted by the first grating.

3. A projection exposure method, according to claim 1 wherein said imaging optics has a critical frequency f, when used with said first grating which is greater than the critical frequency f0 of said imaging optics without such grating, and less than twice the value of f0.

4. A projection exposure method, according to claim 1 wherein said first grating has a spatial pitch P1 in at least one direction and in the following range:

$$\lambda/(1.42*NA) <= P1 <= \lambda/NA.$$

5. A projection exposure method, according to claim 1, wherein a first opaque pattern, which has a width in the one direction of less than Z1·NA (where Z1 is the optical path length between the first grating and the substrate) and has a spatial pitch almost equal to 2·Z1·NA, is provided between the substrate and the first grating, a second opaque pattern is provided immediately above or below the mask to shield an area on the mask almost conjugate with the first opaque pattern to limit an exposure field, and the limited exposure field is exposed either by scanning over the substrate or by moving it stepwise.

6. A projection exposure method according to claim 4 wherein said first grating is a phase grating.

7. A projection exposure method according to claim 2, wherein a second grating, which is parallel to the mask and has a spatial pitch P2 in one direction, is provided between the mask and the projection optics, and the mask is illuminated simultaneously with coherent beams from two different directions such that incident angles θi (angle between an incoming beam and the optical axis) in a plane containing the pitch direction and the optical axis is given by $$\sin(\theta i) = \pm [\lambda/(M \cdot P1) + \lambda/P2].$$

8. A projection exposure method according to claim 7 wherein said method is carried out with an arrangement approximately satisfying the equation, Z2=M*(P2/P1)*Z1, where optical path length Z2 is the distance between the second grating and the mask, and optical path length Z1 is the distance between the grating and the substrate.

9. A projection exposure method, according to claim 7, comprising coherently or partially coherently illuminating the mask from above through a third grating a with spatial pitch P3 in a single direction, said third grating disposed in parallel to the mask between the mask and the illumination optics, and approximately defined by the following equation.

$$1/P3 = 1/(M \cdot P1) + 1/P2.$$

10. A projection exposure method, according to claim 9 wherein said second and third gratings are phase gratings.

11. A projection exposure method as claimed in claim 1, wherein a second imaging optics are disposed between the mask and the projection optics and further including inserting a second grating at a position that is approximately a conjugate of said first phase grating, and said second grating having a spatial pitch P2 in one direction described approximately as:

$$P2 = P1 * M_c.$$

12. A projection exposure method, as claimed in claim 1 comprising to simultaneously illuminating patterns existing in two locations on the mask, both containing the desired identical patterns, with a coherent light from at least two unique directions.

13. A projection exposure method according to claim 1, the wavefront aberration of the projection optics are compensated to be symmetrical with respect to the diameter, on the pupil plane, perpendicular to the direction of illumination and illuminating the mask with a pair of coherent illumination with an incident angle symmetrical with respect to the optical axis.

14. A projection exposure method, according to claim 1, wherein the mask contains an alternate phase shift mask.

15. A projection exposure method according to claim 1, said mask has a fine pattern in a particular direction, depending on the pitch and direction of the first grating.

16. A projection exposure method according to claim 1 wherein said mask is constructed to compensate for the pattern shapes, depending on the pitch and direction of the pattern of the first grating.

17. A projection exposure method according to claim 1, further including filling the gap between the first grating and the substrate with a liquid with an index of refraction n greater than 1 wherein the NA of the projection optics is in the following range:

$$0.5 < NA < n/2.$$

18. Projection exposure equipment, for projecting an image of a mask onto a substrate comprising:
a) a light source directed onto the mask;
b) projection optics to project an image of said mask;
c) a diffraction grating diffracting the light from said projection optics; and
d) a stage for securing the substrate disposed below said diffraction grating.

19. Projection exposure equipment for projecting an image of a mask having a pattern thereon onto a substrate comprising:
a) a light source directed onto the mask;
b) a first diffraction grating disposed to diffract the light from the pattern on the mask;
c) projection optics projecting the diffracted light onto a substrate;
d) a second diffraction grating disposed to diffract light from said projection optics; and
e) a stage for securing the substrate disposed below said second diffraction means.

20. Projection exposure equipment comprising:
a) a light source directed toward the mask;
b) a first diffraction grating between said light source and said mask to diffract the light from said source such that it enters the mask at an oblique incident;
c) projection optics to project the mask pattern onto a substrate;
d) a second diffraction grating diffracting light from projection optics; and
e) a stage on which to place the substrate disposed below the second diffractor.

21. Projection exposure equipment comprising:
a) a light source emitting light of wavelength λ;
b) a mask stage for receiving a mask;
c) a substrate stage for receiving a substrate;
d) illumination optics directing the light from said light source onto a mask on said mask stage;
e) projection optics, having a numerical aperture (NA) and magnification (M:1) imaging patterns of the mask onto a substrate surface on said substrate stage;
f) a first diffraction grating with a spatial pitch P1(λ/1.42*NA) ≤P1≤λ/NA) in at least one direction, disposed at a position Z1, where Z1 is the optical path length between the substrate and the projection optics to diffract light from said projection optics; and g) an optical element selected from the group consisting of imaging optics or a second grating disposed between the mask and the illumination optics, or between the projection optics and the mask, said optical element forming an image of the mask pattern nearby the surface of the substrate by interference of light diffracted by said first grating.

22. Projection equipment according to claim 21 and further including, between the substrate and the first grating an opaque pattern selected from the group consisting of a pattern with a spatial pitch of approximately 2*NA*Z1 and a width, less than Z1*NA in one direction, a function that can image by scanning the imaging field, limited by the opaque patterns, on the substrate and a function that can image while moving the image field in step-like movements.

23. Projection equipment according to claim 21 wherein said light source provides at least partially coherent light and further including a third grating, said grating being a phase grating through which said light is directed onto the mask from approximately above, said third grating disposed between said illumination optics and the mask and having a spatial pitch P3 of approximately equal to:

$$1/P3 = 1/(M \cdot P1) + 1/P2$$

in one direction, and parallel to the mask; and said imaging optics comprise a second phase grating with a spatial pitch P2 in one direction, and parallel to the mask between the mask and the projection optics, the position of second phase grating being approximately Z2=M*(P2/P1)*Z1.

24. Exposure equipment comprising:
a) a light source for exposure;
b) a holding means for holding a mask having a specified pattern;
c) a projection optics;
d) a stage on which a wafer substrate is mounted;
e) a second holding means disposed between the projection optics and the stage to hold a first grating that diffracts exposure light form the light source; and
f) a third holding means disposed between the light source and the projection optics to hold an image forming means which forms the image of the specified pattern from the exposure light diffracted by the first grating.

25. Exposure equipment according to claim 24 wherein said imaging means includes means to obliquely illuminate the mask with the exposure light, and a second grating disposed between the mask and the projection optics.

26. Exposure equipment according to claim 24 wherein said imaging means includes imaging optics between the mask and the projection optics, and a second grating disposed between the imaging optics and the projection optics.

27. Exposure equipment according to claim 24 wherein said imaging means includes means to illuminate identical patterns provided in different areas of the mask with the exposure light from different directions.

28. Exposure equipment according to claim 25 wherein the pitch P2 of the second grating is $$P2 \leq M \cdot P1$$

where P1 is the pitch of the first grating, and M is the magnification of the projection optics.

29. Exposure equipment according to claim 25 wherein the equation $$\sin(\theta i) = \pm \{1/(M \cdot P1) + 1/P2\}$$

is satisfied where $\theta i$ is the incident angle of the exposure light to the mask, $\lambda$ is the wavelength of the exposure light, M is the magnification of the projection optics, P1 is the pitch of the first grating, and P2 is the pitch of the second grating.

30. Exposure equipment according to 25 wherein the equation $$Z2 = M^*(P2/P1)^*Z1$$

is satisfied where Z1 is the distance between the pattern formed from the exposure light diffracted from the first grating, and the first grating, Z2 is the distance between the mask and the second grating, M is the magnification of the projection optics, P1 is the pitch of the first grating, and P2 the pitch of the second grating.

31. Exposure equipment according to claim 25 wherein said illumination means include a third grating between the light source and the mask.

32. Exposure equipment according to claim 31, wherein the equation $$1/P3 = 1/(M \cdot P1) + 1/P2$$

is satisfied where P3 is the pitch of the third grating, M is the magnification of the projection optics, P1 is of the pitch of the first grating, and P2 is the pitch of the pitch of the second grating.

33. Exposure equipment according to claim 32 wherein said second and the third gratings are phase gratings.

34. Exposure equipment according to claim 24, wherein said mask is a phase shift mask.

35. Exposure equipment according to claim 24 and further including a liquid with an index of refraction n greater than 1 filling the area between the projection optics and the stage.

36. Exposure equipment according to claim 35, wherein the equation $$0.5 < NA < n/2$$

is satisfied where NA is the numerical aperture of the projection optics.

37. Exposure equipment according to claim 24, wherein said first grating is a phase grating.

38. Exposure equipment according to claim 25, and further including fourth means for securing between the first grating and the stage and a mask with an opaque pattern disposed on said fourth securing means.

39. Exposure equipment in claim 38 wherein said first grating is created on a quartz substrate, and said opaque mask is created on the other side of said same quartz substrate.

40. Exposure equipment according to claim 25 and further including a fourth means for securing disposed between the projection optics and the light source and a masking blade disposed on said fourth securing means.

41. Exposure equipment according to claim 25 wherein said projection optics are constructed such as to compensate aberrations.

42. Exposure equipment according to claim 41 wherein said compensation is provided by a slit filter positioned in the pupil plane of said projection optics.

43. Exposure equipment according to claim 25, and further including means to compensate aberrations disposed either between the mask and the projection optics, or between the substrate stage and the projections optics.

44. Exposure equipment according to claim 43 wherein said means to compensate comprise an optically flat transparent plate.

45. Exposure equipment according to claim 26 wherein said second grating between the imaging optics and the projection optics is disposed in a position approximately conjugate to the first grating.

46. Exposure equipment according to claim 27 wherein said means which illuminate the patterns on the mask with exposure light from different directions includes a prism.

47. Exposure equipment according to claim 24 wherein said first securing means include a translation stage for the first grating.

48. Exposure equipment according to claim 24, and further including an autofocus monitor, having an output and means to control the position of the first grating depending on said output from the autofocus monitor.

49. Exposure equipment according to claim 26 wherein said imaging optics include a micro lens array.

50. Exposure equipment according to claim 49 and further including an opaque pattern disposed between said projection optics and said second grating, said opaque pattern, said second grating, and said micro lens array combined into a single physical unit.

51. Exposure equipment according to 49, and further including an opaque pattern disposed between the projection optics and the second grating, and wherein the pitch of said micro lens array and the pitch of the exposure area of said opaque pattern are equal.

52. Exposure equipment according to claim 24 wherein said the mask is a mask removed of shape distortions formed in the peripheral area of periodic patterns.

53. A pattern creation method utilizing exposure equipment including a light source for exposure, a mask support, projection optics, and a substrate stage comprising:
   a) supporting a mask with a prescribed pattern utilizing the mask support;
   b) supporting a first grating between the stage and the projection optics;
   c) supporting an imaging optical element which forms the image of the fixed pattern through the exposure light, from the light source, which is diffracted by the first grating,
   d) placing a substrate coated with a photo sensitive film onto the stage; and
   e) exposing the surface of the substrate with a exposure light which passes through the mask, imaging optical element, the projection optics, and the first grating.

54. The pattern forming method claimed in claim 53 wherein said imaging optical element includes a second grating disposed between the mask and the projection optics.

55. The pattern forming method claimed in claim 53 wherein said imaging optical element include imaging optics disposed between the mask and the projection optics, and a second grating disposed between the imaging optics and the projection optics.

56. The pattern forming method of claim 53 wherein said mask includes identical patterns in separate areas.

57. The pattern forming method of claim 54, wherein the equation $$P2<=M \cdot P1$$

is satisfied where P2 is the pitch of the second grating, P1 is the pitch of the first grating, and M is the magnification of the projection optics.

58. The pattern forming method of claim 54 wherein the equation $$\sin(\theta i)=\pm\{1/(M \cdot P1)+1/P2\}$$

is satisfied when $\theta i$ is the incident angle of the exposure light onto the mask, $\lambda$ is the wavelength of the exposure light, M is the magnification of the projection optics, P1 is the pitch of the first grating, and P2 is the pitch of the second grating.

59. The pattern forming method of claim 54 wherein the equation $$Z2=M*(P2/P1)*Z1$$

is satisfied where Z1 is the distance between the pattern formed from the exposure light diffracted from the first grating, and the first grating, Z2 is the distance between the mask and the second grating, M is the magnification of the projection optics, P1 of the pitch of the first grating, and P2 is the pitch of the second grating.

60. The pattern forming method of claim 54, and further including a third grating between the light source and the mask.

61. The pattern forming method of claim 60, wherein the equation $$1/P3=1/(M \cdot P1)+1/P2$$

is satisfied where P3 is the pitch of the third grating, M is the magnification of the projection optics, P1 is of the pitch of the first grating, and P2 is the pitch of the second grating.

62. The pattern forming method of claim 60, wherein the second grating and third grating are phase gratings.

63. The pattern forming method of claim 53 wherein the mask is a phase shift mask.

64. The pattern forming method of claim 53, and further including filling the area between the projection optics and the stage with a liquid with an index of refraction n greater than 1.

65. The pattern forming method of claim 64, wherein the equation $$0.5<NA<n/2$$

is satisfied where NA is the numerical aperture of the projection optics.

66. The pattern forming method of claim 53 wherein the first grating is a phase grating.

67. The pattern forming method of claim 54 and further including inserting an opaque mask between the first phase grating and the stage.

68. The pattern forming method in claim 67 comprising creating the first phase grating on one side of a quartz substrate and creating the opaque mask on the opposite side of the same quartz substrate.

69. The pattern forming method of claim 54 and further including disposing a masking blade between the projection optics and the light source.

70. The pattern forming method of claim 53 wherein the exposure step includes scanning the imaging field on the surface of the substrate.

71. The pattern forming method of claim 70, the ratio of the scanning speed of the mask to the scanning speed of the substrate materials is 1:M where M is the magnification of the projection optics.

72. The pattern forming method of claim 53 wherein the photo sensitive film is a chemically amplified type resist film.

73. The pattern forming method of claim 53 wherein the exposure light is a partially coherent light.

74. The pattern forming method of claim 53 wherein said the first grating is a two-dimensional grating.

75. The pattern forming method in claim 74 wherein said two-dimensional grating is a checkered pattern.

76. The pattern forming method of claim 74 wherein said two-dimensional grating is a lines-and-spaces pattern.

77. The pattern forming method of claim 53 and further including, after the exposure step, rotating said first grating approximate 90 degrees; and carrying out a further exposure step to re-expose said substrate.

78. The pattern forming method in claim 53 and further including, after said exposure step, removing said first grating and said image forming means and carrying out a second exposure step to re-expose said substrate.

* * * * *

UNITED STATES PATENT AND TRADEMARK OFFICE
CERTIFICATE OF CORRECTION

PATENT NO. : 5,715,039
DATED : 3 February 1998
INVENTOR(S) : Hiroshi FUKUDA et al.

It is certified that error appears in the above-identified patent and that said Letters Patent is hereby corrected as shown below:

| Column | Line | |
|---|---|---|
| 6 | 48 | Change "+1st" to --±1st--. |
| 7 | 57 | After "$\sqrt{2}$" insert -- · --. |
| 9 | 40 | Change "2NAZB" to --2·NA·ZB--. |
| 9 | 62 | Change "W≦NAZB" to --W≦NA·ZB--. |

Signed and Sealed this

Eighth Day of September, 1998

BRUCE LEHMAN

Attest:

Attesting Officer   Commissioner of Patents and Trademarks